United States Patent
Kim et al.

(10) Patent No.: US 12,400,729 B2
(45) Date of Patent: Aug. 26, 2025

(54) SEMICONDUCTOR MEMORY DEVICE AND METHOD OF OPERATING SEMICONDUCTOR MEMORY DEVICE

(71) Applicant: Samsung Electronics Co., Ltd., Suwon-si (KR)

(72) Inventors: Jongcheol Kim, Suwon-si (KR); Taeyoung Oh, Suwon-si (KR); Hyongryol Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 94 days.

(21) Appl. No.: 18/448,346

(22) Filed: Aug. 11, 2023

(65) Prior Publication Data
US 2024/0221860 A1  Jul. 4, 2024

(30) Foreign Application Priority Data
Jan. 4, 2023  (KR) .......................... 10-2023-0000999

(51) Int. Cl.
G11C 29/00  (2006.01)

(52) U.S. Cl.
CPC ............ G11C 29/76 (2013.01); G11C 29/789 (2013.01)

(58) Field of Classification Search
CPC ..... G11C 29/76; G11C 29/789; G11C 29/785; G11C 29/808; G11C 29/787; G11C 2029/1202
See application file for complete search history.

(56) References Cited

U.S. PATENT DOCUMENTS

| | | | |
|---|---|---|---|
| 6,005,813 A | * | 12/1999 | Waller .................. G11C 29/80 365/201 |
| 6,018,482 A | | 1/2000 | Fujita |
| 6,262,923 B1 | | 7/2001 | Fujita |
| 6,421,286 B1 | | 7/2002 | Ohtani et al. |
| 6,445,627 B1 | | 9/2002 | Nakahara et al. |

(Continued)

FOREIGN PATENT DOCUMENTS

| | | |
|---|---|---|
| KR | 100429237 B1 | 4/2004 |
| KR | 100895065 B1 | 5/2009 |

(Continued)

*Primary Examiner* — Mohammed A Bashar
(74) *Attorney, Agent, or Firm* — Wolf, Greenfield & Sacks, P.C.

(57) ABSTRACT

A semiconductor memory device includes a plurality of memory cells partitioned into a plurality of row blocks that are each associated with at least one respective row block identity bit within a portion of a row address. A row decoder is provided, which includes a repair controller having a plurality of fuse boxes therein that correspond to respective ones of the plurality of row blocks and include a first fuse box configured to store a first defective address. The repair controller is configured to: (i) activate a first redundancy word-line, which replaces a first defective word-line designated by the first defective address, in response to comparing a first access address with the first defective address output from the first fuse box, during a first mode, and (ii) activate a second redundancy word-line, which replaces a first edge word-line designated by the first access address, in response to comparing the first access address with a first reset address output from the first fuse box, during a second mode.

20 Claims, 29 Drawing Sheets

(56) References Cited

U.S. PATENT DOCUMENTS

| | | |
|---|---|---|
| 6,842,387 B2 | 1/2005 | Kang |
| 7,336,549 B2 | 2/2008 | Min et al. |
| 7,885,111 B2 | 2/2011 | Chae et al. |
| 8,015,457 B2 | 9/2011 | Koshikawa et al. |
| 8,737,146 B2 | 5/2014 | Kim et al. |
| 9,418,762 B1 | 8/2016 | You |
| 10,403,383 B2 | 9/2019 | Kim |
| 11,107,544 B2 | 8/2021 | Jung |
| 2002/0024062 A1 | 2/2002 | Nakahara et al. |
| 2006/0092725 A1 | 5/2006 | Min et al. |
| 2006/0098503 A1* | 5/2006 | Jeong .................. G11C 29/808 365/200 |
| 2019/0103147 A1* | 4/2019 | Jones .................. G11C 11/4087 |

FOREIGN PATENT DOCUMENTS

| | | |
|---|---|---|
| KR | 101185549 B1 | 9/2012 |
| KR | 20160106319 A | 9/2016 |
| KR | 20210080944 A | 7/2021 |
| TW | 544687 B | 8/2003 |

* cited by examiner

FIG. 5
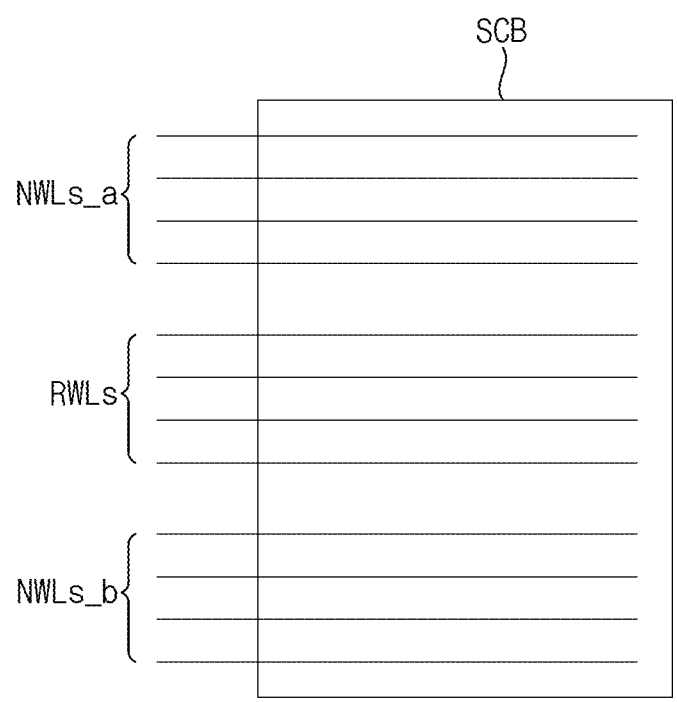
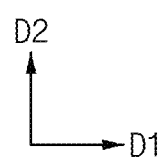

FIG. 18

STATE TABLE

| RST_Q | 1 | 0 | 1 | 0 |
|---|---|---|---|---|
| EN | 0 | 0 | 1 | 1 |
| OPERATING ADDRESS | X | X | RT_ADDR | FL_ADDR |

SEMICONDUCTOR MEMORY DEVICE AND METHOD OF OPERATING SEMICONDUCTOR MEMORY DEVICE

REFERENCE TO PRIORITY APPLICATION

This application claims priority under 35 USC § 119 to Korean Patent Application No. 10-2023-0000999, filed Jan. 4, 2023, the disclosure of which is hereby incorporated herein by reference.

BACKGROUND

The present disclosure relates to integrated circuit devices and, more particularly, to integrated circuit memory devices and methods of operating same. Integrated circuit memory devices may typically be classified as volatile memory devices or nonvolatile memory devices. A volatile memory device refers to a memory device that loses stored data at power-off; an example of a volatile memory device is a dynamic random access memory (DRAM), which may be used in various devices such as mobile systems, servers, and graphic devices.

As a size of a memory cell array of a volatile memory device increases, the characteristics of memory cells may vary according to a position of the memory cells. For example, memory cells connected to edge word-lines located adjacent edges of sub array blocks are typically more susceptible to defects.

SUMMARY

Example embodiments provide an integrated circuit memory device capable of forcibly repairing edge word-lines, which are more susceptible to defects based on their location adjacent edges of memory cells within an array.

Example embodiments provide methods of operating integrated circuit memory devices that are capable of forcibly repairing edge word-lines.

According to example embodiments, a semiconductor memory device includes a bank of memory cells and a row decoder. The bank of memory cells electrically coupled to a plurality of word-lines and a plurality of bit-lines, the bank of memory cells is divided into a plurality of row blocks by a row block identity bit corresponding to a portion of bits of a row address, each of the plurality of row blocks includes a plurality of sub-array blocks arranged in a first direction and the plurality of row blocks are arranged in a second direction crossing the first direction. The row decoder is coupled to the bank of memory cells through the word-lines, and includes a repair controller that includes a plurality of fuse boxes corresponding to the plurality of row blocks. A first fuse box from among the plurality of fuse boxes stores a first defective address. The repair controller activates a first redundancy word-line replacing a first defective word-line designated by the first defective address based on comparing a first access address with the first defective address output from the first fuse box, in a first mode and activates a second redundancy word-line replacing a first edge word-line designated by the first access address based on comparing the first access address with a first reset address output from the first fuse box, in a second mode.

According to example embodiments, there is provided a method of operating a semiconductor memory device which includes a plurality of bank arrays, each of the plurality of bank arrays includes a plurality of memory cells coupled to word-lines and bit-lines, each of the plurality of bank arrays is divided into a plurality of row blocks by a row block identity bit corresponding to a portion of bits of a row address, each of the plurality of row blocks includes a plurality of sub-array blocks arranged in a first direction and the plurality of row blocks are arranged in a second direction crossing the first direction. The row decoder is coupled to the memory cell array through the word-lines. According to the method, when an access address is received from an external memory controller, it is determined whether a logic level of a reset signal output from a reset latch of a fuse box has a first logic level, a first redundancy word-line designated by a repair address replacing a defective address is activated based on comparing the access address with the defective address output from an address latch of the fuse box, in response to the reset signal having the first logic level and a second redundancy word-line replacing an edge word-line designated by the access address is activated based on comparing the access address with a reset address output from the reset latch of the fuse box, in response to the reset signal having a second logic level.

According to example embodiments, a semiconductor memory device includes a memory cell array and a row decoder. The memory cell array includes a plurality of bank arrays, each of the plurality of bank arrays includes a plurality of memory cells coupled to word-lines and bit-lines, each of the plurality of bank arrays is divided into a plurality of row blocks by a row block identity bit corresponding to a portion of bits of a row address, each of the plurality of row blocks includes a plurality of sub-array blocks arranged in a first direction and the plurality of row blocks are arranged in a second direction crossing the first direction. The row decoder is coupled to the memory cell array through the word-lines, and includes a repair controller that includes a plurality of fuse boxes corresponding to the plurality of row blocks. At least one fuse box from among the plurality of fuse boxes stores a defective address. The repair controller activates a redundancy word-line replacing a defective word-line designated by the defective address based on comparing the access address with the defective address output from the at least one fuse box, in a first mode, and activates a second redundancy word-line replacing an edge word-line designated by the access address based on comparing the access address with a reset address output from the at least one fuse box, in a second mode.

According to a further embodiment of the invention, a semiconductor memory device includes a plurality of memory cells partitioned into a plurality of row blocks that are each associated with at least one respective row block identity bit within a portion of a row address. A row decoder is provided, which includes a repair controller having a plurality of fuse boxes therein that correspond to respective ones of the plurality of row blocks and include a first fuse box configured to store a first defective address. The repair controller is configured to: (i) activate a first redundancy word-line, which replaces a first defective word-line designated by the first defective address, in response to comparing a first access address with the first defective address output from the first fuse box, during a first mode, and (ii) activate a second redundancy word-line, which replaces a first edge word-line designated by the first access address, in response to comparing the first access address with a first reset address output from the first fuse box, during a second mode.

Accordingly, in the semiconductor memory device according to example embodiments, a portion of fuse boxes storing defective addresses in the repair controller, in a second mode (when, the portion of fuse boxes are reset), may output a reset address designating an edge word-line disposed at an edge portion of a sub array block instead of outputting a defective address stored therein and the repair controller may bypass an access to the edge word-line by activating a redundancy word-line replacing the edge word-line. Accordingly, the same fuse box may be used to repair the edge word-line that is frequently defective in an early stages of development of the semiconductor memory device, and after the initial stage, the defect address stored in the fuse box may be repaired. Therefore, a performance of the semiconductor memory device may be enhanced without increasing an occupied area of the fuse boxes.

BRIEF DESCRIPTION OF THE DRAWINGS

Example embodiments will be described below in more detail with reference to the accompanying drawings.

FIG. 5 is an example of a sub array block included in the first bank array of FIG. 4.

FIG. 18 is a state table illustrating an example operation of the first fuse box of FIG. 17 according to example embodiments.

DETAILED DESCRIPTION

Various example embodiments will be described more fully hereinafter with reference to the accompanying drawings, in which example embodiments are shown.

Figure 1:
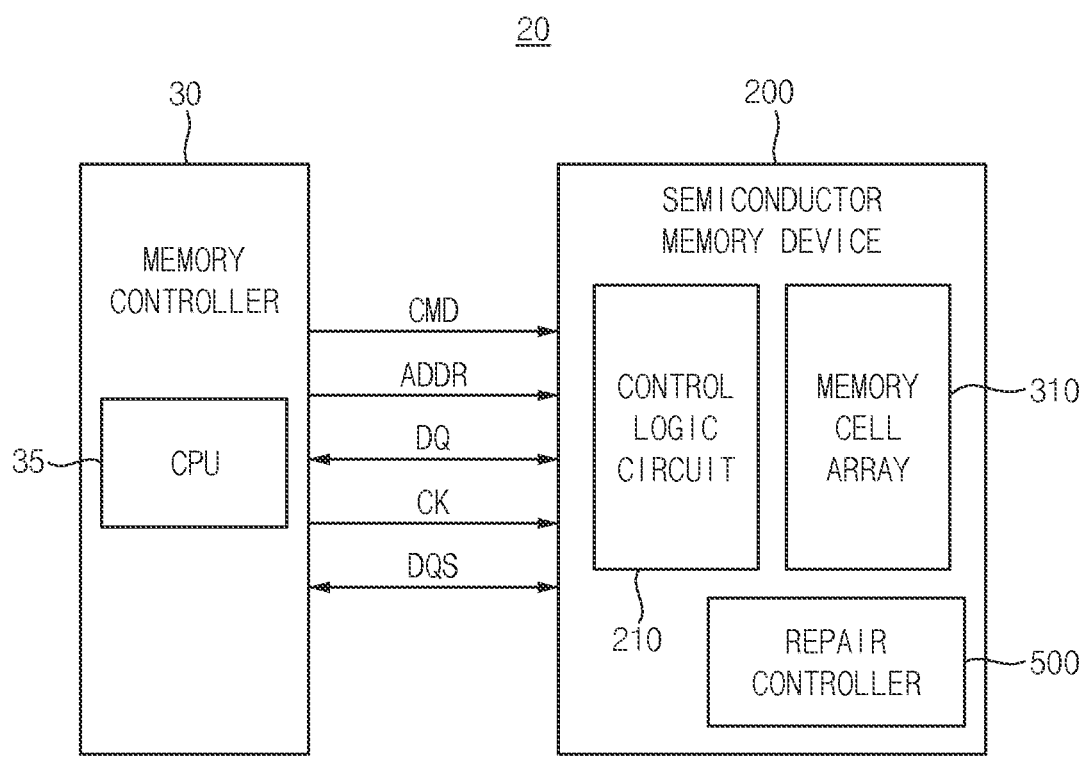
FIG. 1 is a block diagram illustrating a memory system according to example embodiments.

FIG. 1 is a block diagram illustrating a memory system according to example embodiments. Referring to FIG. 1, a memory system 20 may include a memory controller 30 and a semiconductor memory device 200. The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), a DDR6 SDRAM, or the like. The memory controller 30 may transmit a clock signal CK (the clock signal CK may be referred to a command clock signal), a command CMD, and an address (signal) ADDR to the semiconductor memory device 200. Herein, for convenience of description, the terms of a clock signal CK, a command CMD, and an address ADDR and the terms of clock signals CK, commands CMD, and addresses ADDR may be used interchangeably. The memory controller 30 may transmit a data strobe signal DQS to the semiconductor memory device 200 when the memory controller 30 writes data signal DQ in the semiconductor memory device 200. The semiconductor memory device 200 may transmit a data strobe signal DQS to the memory controller 30 when the memory controller 30 reads data signal DQ from the semiconductor memory device 200. The address ADDR may be accompanied by the command CMD and the address ADDR may be referred to as an access address. The memory controller 30 may include a central processing unit (CPU) 35 that controls overall operation of the memory controller 30.

The semiconductor memory device 200 may include a memory cell array 310 that stores the data signal DQ, a control logic circuit 210 and a repair controller 500. The control logic circuit 210 may control operations of the semiconductor memory device 200. The memory cell array 310 may include a plurality of bank arrays, and each of the plurality of bank arrays may include a plurality of memory cells coupled to word-lines and bit-lines. Each of the plurality of bank arrays may be divided into a plurality of row blocks by a row block identity bit corresponding to a portion of bits of a row address, each of the of row blocks may include a plurality of sub-array blocks arranged in a first direction, and the plurality of row blocks may be arranged in a second direction that is perpendicular to the first direction. The memory cells in each of the bank array may be referred to as a bank of memory cells. Therefore, the bank of memory cells may be divided into the plurality of row blocks by the row block identity bit.

The repair controller 500 may include a plurality of fuse boxes corresponding to the plurality of row blocks. A first fuse box from among the plurality of fuse boxes may store a first defective address. The repair controller 500 may activate a first redundancy word-line replacing a first defective word-line designated by the first defective address based on comparing a first access address with the first defective address output from the first fuse box, in a first mode, and may activate a second redundancy word-line replacing a first edge word-line designated by the first access address based on comparing the first access address with a first reset address output from the first fuse box, in a second mode. The repair controller 500 may forcibly repair an edge word-line with the second redundancy word-line.

The semiconductor memory device 200 performs a refresh operation periodically due to charge leakage of memory cells storing data. Due to scale down of the manufacturing process of the semiconductor memory device 200, the storage capacitance of the memory cell is typically decreased and the refresh period is typically shortened (i.e., refresh frequency is typically increased). The refresh period may be further shortened because the entire refresh time is increased as the memory capacity of the semiconductor memory device 200 is increased.

Figure 2:
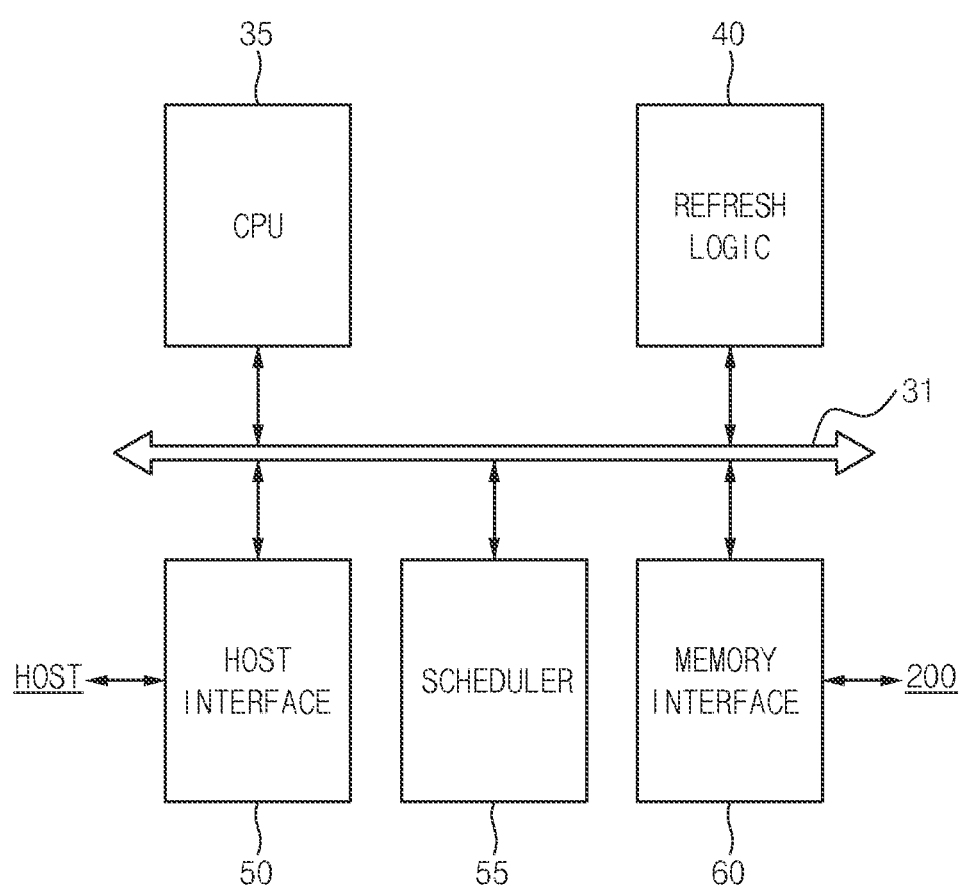
FIG. 2 is a block diagram illustrating the memory controller in FIG. 1 according to example embodiments.

FIG. 2 is a block diagram illustrating the memory controller in FIG. 1 according to example embodiments. Referring to FIG. 2, the memory controller 30 may include the CPU 35, a refresh logic 40, a host interface 50, a scheduler 55 and a memory interface 60 which are connected to each other through a bus 31.

The CPU 35 may control overall operation of the memory controller 30. The CPU 35 may control the refresh logic 40, the host interface 50, the scheduler 55 and the memory interface 60 through the bus 31. The refresh logic 40 may generate auto refresh command for refreshing memory cells of the plurality of memory cell rows based on a refresh interval of the semiconductor memory device 200. The host interface 50 may perform interfacing with a host. The memory interface 60 may perform interfacing with the semiconductor memory device 200.

The scheduler 55 may manage scheduling and transmission of sequences of commands generated in the memory controller 30. The scheduler 55 may transmit the active command and a subsequent command to the semiconductor memory device 200 via the memory interface 60 and the semiconductor memory device 200 may perform a memory operation on the target memory cell in response to the subsequent command.

Figure 3:
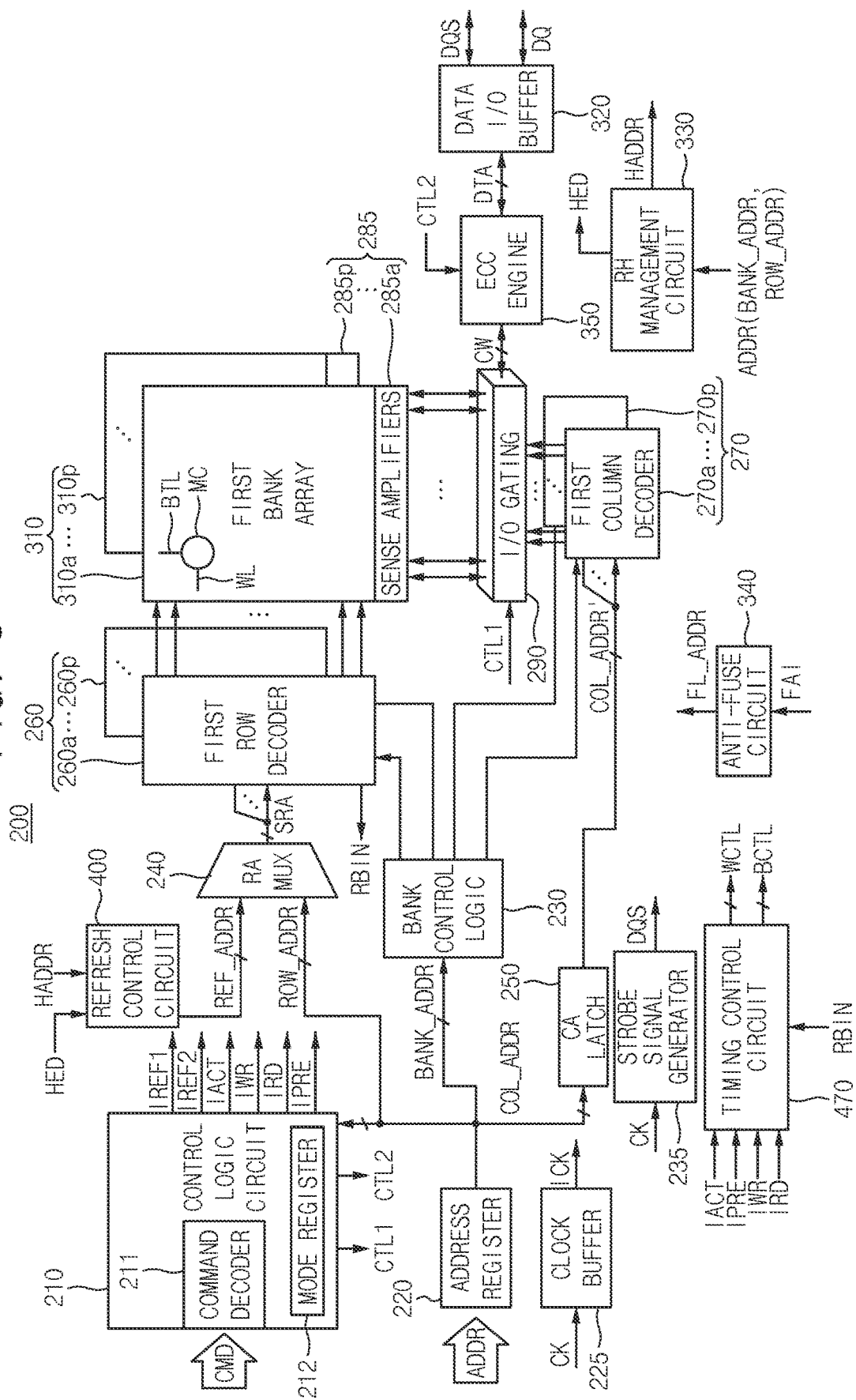
FIG. 3 is a block diagram illustrating an example of the semiconductor memory device in FIG. 1 according to example embodiments.

FIG. 3 is a block diagram illustrating an example of the semiconductor memory device in FIG. 1 according to example embodiments. Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an input/output (I/O) gating circuit 290, an error correction code (ECC) engine 350, a clock buffer 225, a strobe signal generator 235, a row hammer (RH) management circuit 330, an anti-fuse circuit 340, a timing control circuit 470 and a data I/O buffer 320.

The memory cell array 310 may include first through sixteenth bank arrays 310a~310p. The row decoder 260 may include first through sixteenth row decoders 260a~260p respectively coupled to the first through sixteenth bank arrays 310a~310p, the column decoder 270 may include first through sixteenth column decoders 270a~270p respectively coupled to the first through sixteenth bank arrays 310a~310p, and the sense amplifier unit 285 may include first through sixteenth sense amplifiers 285a~285p respectively coupled to the first through sixteenth bank arrays 310a~310p.

The first through sixteenth bank arrays 310a~310p, the first through sixteenth row decoders 260a~260p, the first through sixteenth column decoders 270a~270p and first through sixteenth sense amplifiers 285a~285p may form first through sixteenth banks. Each of the first through sixteenth bank arrays 310a~310p includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250 and the row hammer management circuit 330.

The bank control logic 230 may generate bank control signals in response to the bank address BANK_ADDR. One of the first through sixteenth row decoders 260a~260p corresponding to the bank address BANK_ADDR is activated in response to the bank control signals, and one of the first through sixteenth column decoders 270a~270p corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260p.

The refresh control circuit 400 may sequentially increase or decrease the refresh row address REF_ADDR in a normal refresh mode in response to first and second refresh control signals IREF1 and IREF2 from the control logic circuit 210. The refresh control circuit 400 may receive a hammer address HADDR in a hammer refresh mode, and may output one or more hammer refresh row addresses designating one or more victim memory cell rows physically adjacent to a memory cell row corresponding to the hammer address as the refresh row address REF_ADDR.

The activated one of the first through sixteenth row decoders 260a~260p, by the bank control logic 230, may decode the row address SRA that is output from the row address multiplexer 240, and may activate a word-line corresponding to the row address SRA. For example, the activated bank row decoder applies a word-line driving voltage to the word-line corresponding to the row address. The column address latch 250 may receive the column address COL_ADDR from the address register 220, and may temporarily store the received column address COL_ADDR. In some embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a~270p. The activated one of the first through sixteenth column decoders 270a~270p activates a sense amplifier corresponding to the bank address BANK_ADDR and the column address COL_ADDR through the I/O gating circuit 290. The I/O gating circuit 290 may include a circuitry for gating input/output data, and may further include input data mask logic, read data latches for storing a codeword that is output from the first through sixteenth bank arrays 310a~310p, and write drivers for writing data to the first through sixteenth bank arrays 310a~310p.

Codeword CW read from a selected one bank array of the first through sixteenth bank arrays 310a~310p is sensed by a sense amplifier coupled to the selected one bank array from which the data is to be read, and is stored in the read data latches. The codeword CW stored in the read data latches may be provided to the data I/O buffer 320 as data DTA after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in a selected one bank array of the first through sixteenth bank arrays 310a~310p may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in the selected one bank array through the write drivers.

The data I/O buffer 320 may provide the data signal DQ from the memory controller 30 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 30 in a read operation of the semiconductor memory device 200. The ECC engine 350 may perform an ECC encoding on the data DTA and may perform an ECC decoding on the codeword CW based on a second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR. The strobe signal generator 235 may receive the clock signal CK, may generate the data strobe signal DQS based on the clock signal CK and may provide the data strobe signal DQS to the memory controller 30. The anti-fuse circuit 340 may receive defective address information FAI including the defective addresses from the memory controller 30 and may provide the defective address information FAI to the repair controller 500 in FIG. 1 during a power-up sequence of the semiconductor memory device 200.

The row hammer management circuit 330 may receive the access address ADDR including the bank address BANK_ADDR and the row address ROW_ADDR from the memory controller 30, may count the number of access associated with each of the plurality of memory cell rows based on the access address ADDR (i.e., active command from the memory controller 30) to store the counted values in count cells of each of the plurality of memory cell rows as count data, and may determine a hammer address HADDR associated with at least one of the plurality of memory cell rows, which is intensively accessed, based on the counted values. Herein, the terms "intensively accessed" may mean that a particular memory cell row is accessed equal to or more than a reference number of times. The row hammer management circuit 330 may provide the refresh control circuit 400 with the hammer address HADDR and a hammer event detection signal HED indicating that a row hammer occurs.

The control logic circuit 210 may control operations of the semiconductor memory device 200. For example, the control logic circuit 210 may generate control signals for the semiconductor memory device 200 in order to perform a write operation, a read operation, a normal refresh operation and a hammer refresh operation. The control logic circuit 210 includes a command decoder 211 that decodes the command CMD received from the memory controller 30 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit 290 and may provide the second control signal CTL2 to the ECC engine 350. In addition, the command decoder 211 may generate internal command signals including the first refresh control signal IREF1, the second refresh control signal IREF2, an active signal IACT, a precharge signal IPRE, a read signal IRD and a write signal IWR by decoding the command CMD.

The timing control circuit 470 may receive the active signal IACT, the precharge signal IPRE, the read signal IRD, the write signal IWR and a row block information signal RBIN and may generate a word-line control signal WCTL for controlling word-lines and a bit-line control signal BCTL for controlling bit-lines. The timing control circuit 470 may provide the word-line control signal WCTL and the bit-line control signal BCTL to the memory cell array 310.

Figure 4:
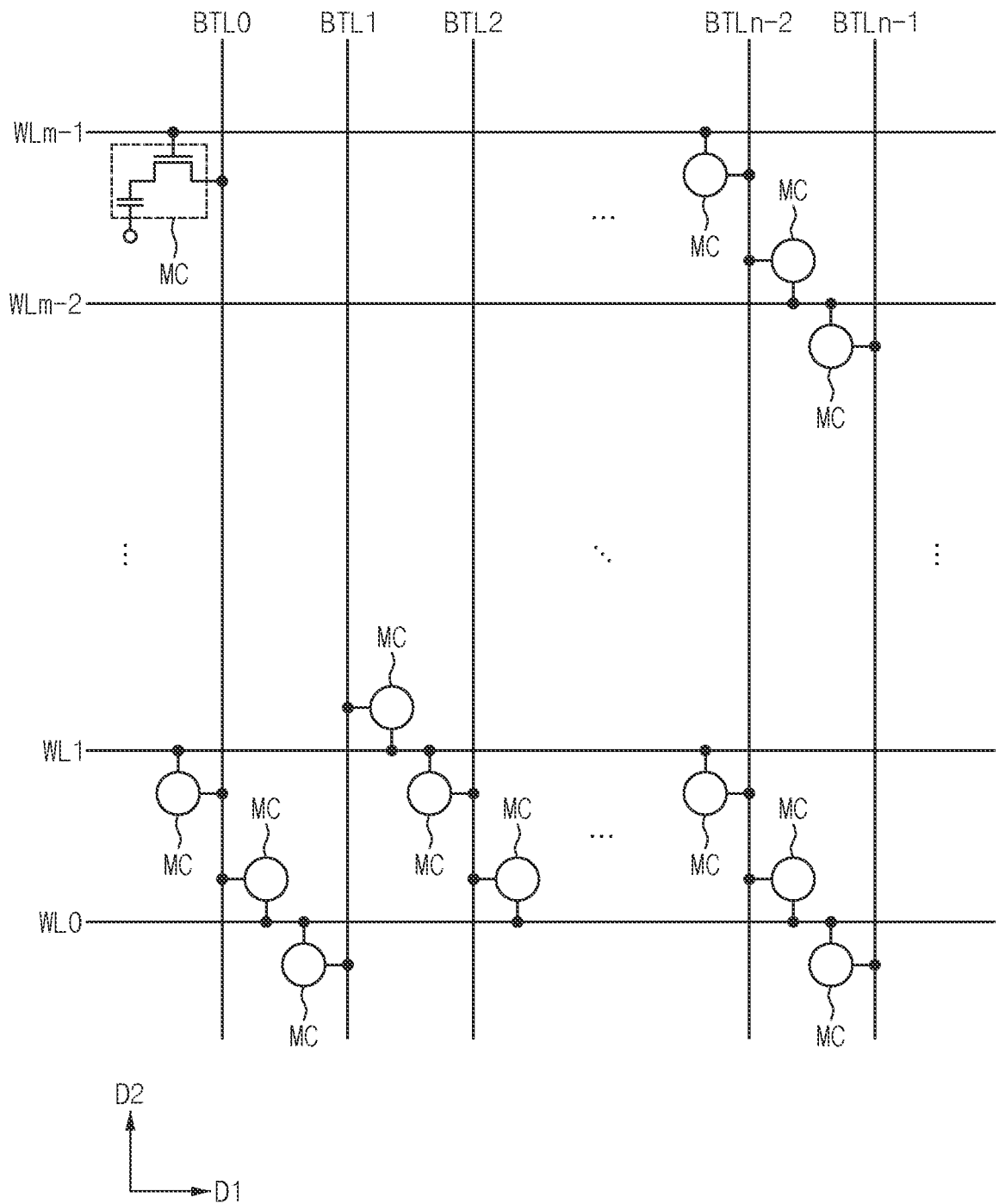
FIG. 4 illustrates an example of the first bank array in the semiconductor memory device of FIG. 3.

FIG. 4 illustrates an example of the first bank array in the semiconductor memory device of FIG. 3. Referring to FIG. 4, the first bank array 310a may include a plurality of word-lines WL0~WLm−1 (m is a natural number greater than two), a plurality of bit-lines BTL0~BTLn−1 (n is a natural number greater than two), and a plurality of memory cells MCs disposed at intersections between the word-lines WL0~WLm−1 and the bit-lines BTL0~BTLn−1. Each of the memory cells MCs may include a cell transistor coupled to each of the word-lines WL0~WLm−1 and each of the bit-lines BTL0~BTLn−1 and a cell capacitor coupled to the cell transistor. Each of the memory cells MCs may have a DRAM cell structure. Each of the word-lines WL0~WLm−1 extends in a first direction D1 and each of the bit-lines BTL0~BTLn−1 extends in a second direction D2 that is orthogonal to the first direction D1. The word-lines WL0~WLm−1 coupled to the plurality of memory cells MCs may be associated with (and referred to as) rows of the first bank array 310a and the bit-lines BTL0~BTLn−1 coupled to the plurality of memory cells MCs may be associated with (and referred to as) columns of the first bank array 310a.

FIG. 5 is an example of a sub array block included in the first bank array of FIG. 4. Referring to FIGS. 4 and 5, the first bank array 310 may include a plurality of sub array blocks and one sub array block SCB is illustrated in FIG. 5 as an example. The sub array block SCB may include a plurality of first normal word-lines NWLs_a extending in the first direction D1, a plurality of second normal word-lines NWLs_b extending in the first direction D1 and a plurality of redundancy word-lines RWLs disposed between the first normal word-lines NWLs_a and the second normal word-lines NWLs_b. In addition, at least one edge word-line, which is disposed at an edge portion of the sub array block SCB, from among the first normal word-lines NWLs_a and the second normal word-lines NWLs_b may be repaired with one of the redundancy word-lines RWLs.

Figure 6:
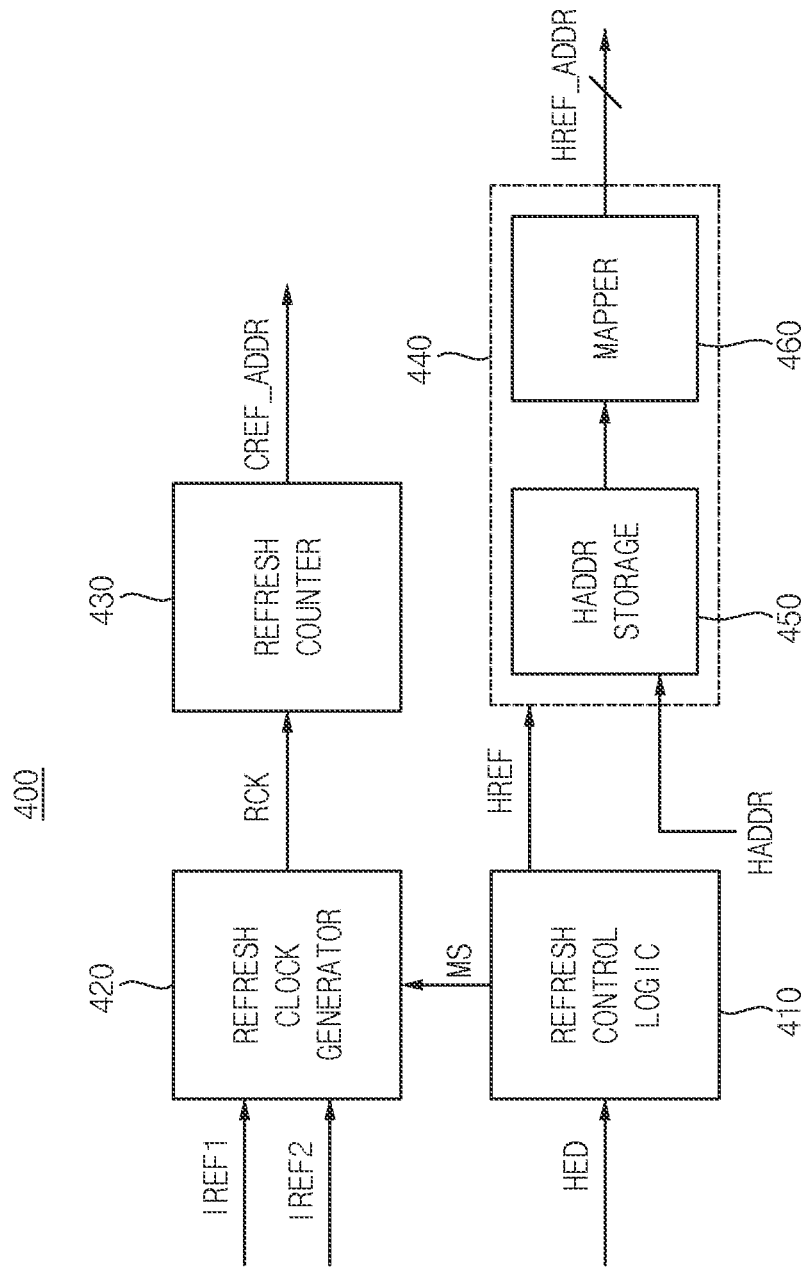
FIG. 6 is a block diagram illustrating an example of the refresh control circuit in FIG. 3 according to example embodiments.

FIG. 6 is a block diagram illustrating an example of the refresh control circuit in FIG. 3 according to example embodiments. Referring to FIG. 6, the refresh control circuit 400 may include a refresh control logic 410, a refresh clock generator 420, a refresh counter 430 and a hammer refresh address generator 440. The refresh control logic 410 may provide a mode signal MS in response to the hammer event detection signal HED. In addition, the refresh control logic 410 may provide the hammer refresh address generator 440 with a hammer refresh signal HREF to control output timing of the hammer address in response to one of the first refresh control signal IREF1 and the second refresh control signal IREF2.

The refresh clock generator 420 may generate a refresh clock signal RCK indicating a timing of a normal refresh operation based on the first refresh control signal IREF1, the second refresh control signal IREF2 and the mode signal MS. The refresh clock generator 420 may generate the refresh clock signal RCK in response to the receiving the first refresh control signal IREF1 or during activation interval of the second refresh control signal IREF2.

When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address (HADDR) storage 450 and a mapper 460. The hammer address storage 450 may store the hammer address HADDR and may output the hammer address HADDR to the mapper 460 in response to the hammer refresh signal HREF. The mapper 460 may generate one or more hammer refresh addresses HREF_ADDR designating one or more victim memory cell rows physically adjacent to a memory cell row corresponding to the hammer address HADDR. The hammer refresh address generator 440 may provide the hammer refresh address HREF_ADDR as the refresh row address REF_ADDR to the row address multiplexer 240 in FIG. 3.

Figure 7:
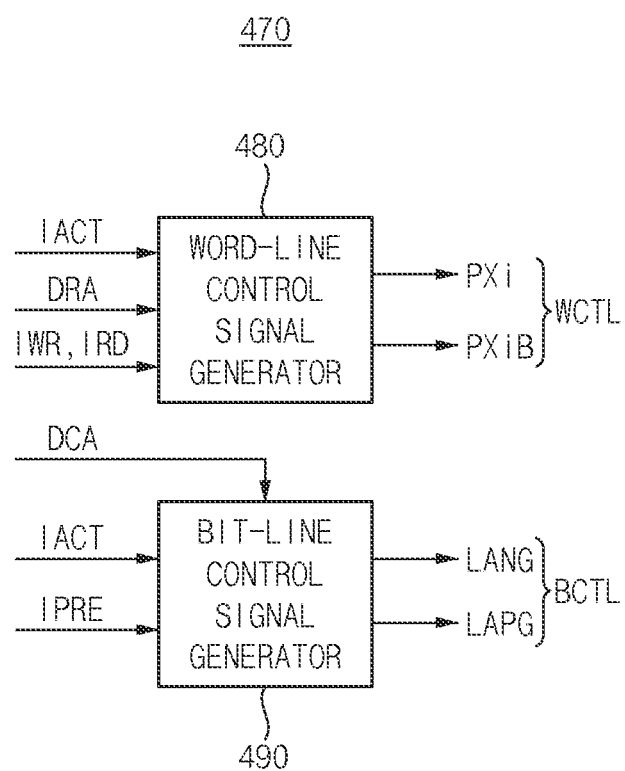
FIG. 7 is a block diagram illustrating an example of the timing control circuit in FIG. 3 according to example embodiments.

FIG. 7 is a block diagram illustrating an example of the timing control circuit in FIG. 3 according to example embodiments. Referring to FIG. 7, the timing control circuit 470 may include a word-line control signal generator 480 and a bit-line control signal generator 490. The word-line control signal generator 480 may generate a word-line control signal WCTL including first and second word-line control signals PXi and PXiB to control a word-line based on the internal command signals IACT, IWR and IRD corresponding to the command CMD a decoded row address DRA. In addition, the word-line control signal generator 480 may provide the first and second word-line control signals PXi and PXiB to the memory cell array 310.

The bit-line control signal generator 490 may generate the bit-line control signal BCTL including second control signals LANG and LAPG to control voltage levels of a bit-line pair of a selected memory cell, in response to the internal command signals IACT and IPRE and a decoded column address DCA and may provide the second control signals LANG and LAPG to the memory cell array 310.

Figure 8:
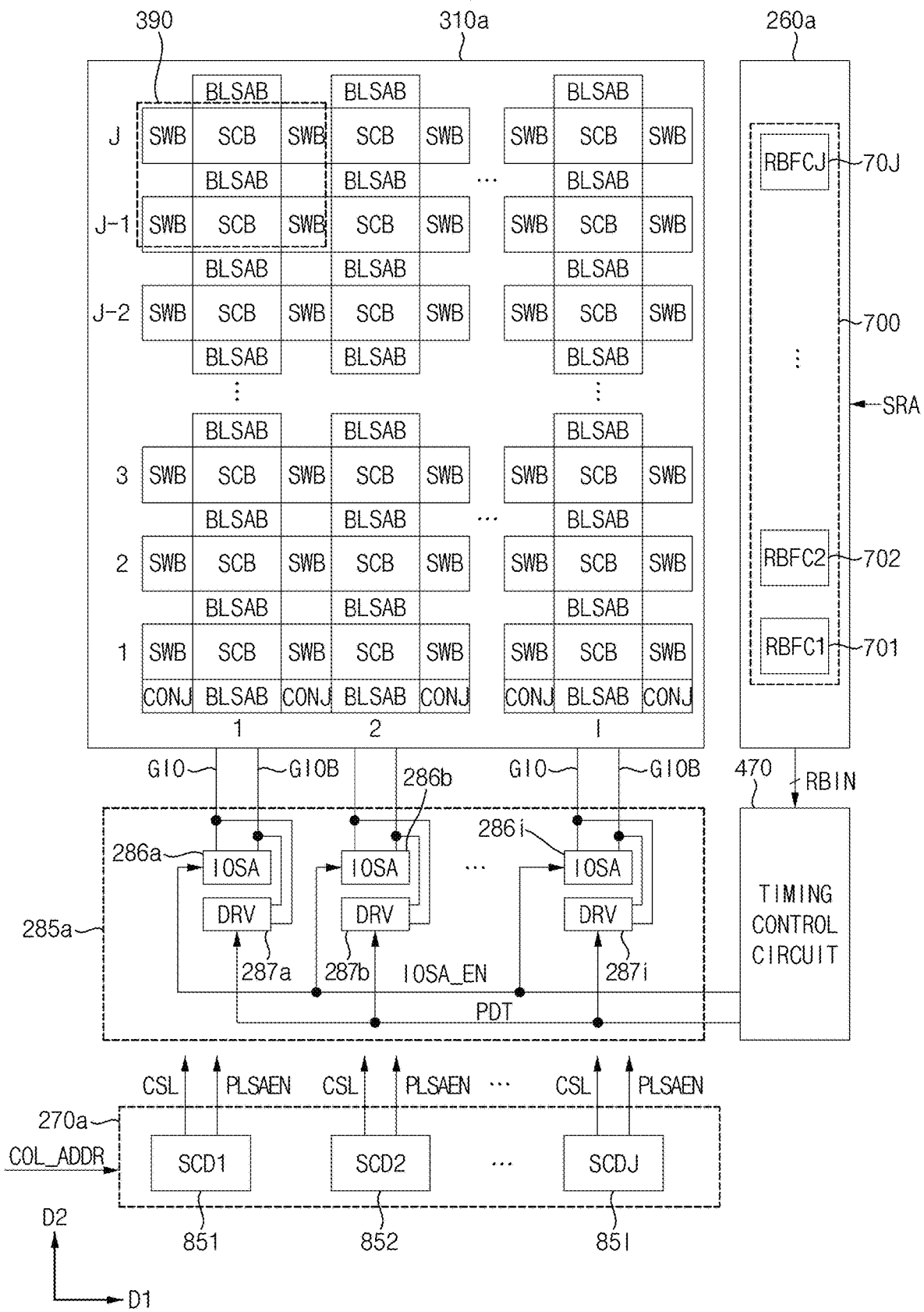
FIG. 8 illustrates a portion of the semiconductor memory device of FIG. 3 according to some example embodiments.

FIG. 8 illustrates a portion of the semiconductor memory device of FIG. 3 according to some example embodiments. In FIG. 8, the first bank array 310, the first row decoder 260a, the first sense amplifier 285a, the first column decoder 270 and the timing control circuit 470 in the semiconductor memory device of FIG. 3 are illustrated. Referring to FIG. 8, in the first bank array 310a, I sub-array blocks SCB may be disposed in the first direction D1, and J sub-array blocks SCB may be disposed in the second direction D2 perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1. A plurality of conjunction regions CONJ may be disposed adjacent the sub word-line driver regions SWB and the bit-line sense amplifier regions BLSAB. A voltage generator may be disposed in each of the conjunction regions CONJ.

The first sense amplifier 285a may be disposed in the first direction D1 with respect to the first bank array 310a and the first sense amplifier 285a may include I I/O sense amplifiers IOSAs 286a, 286b, . . . , 286i and I drivers 287a, 287b, . . . , 287i. Each of the I I/O sense amplifiers IOSAs 286a, 286b, . . . , 286i and each of the I drivers 287a, 287b, . . . , 287i may be connected to global I/O lines GIO and GIOB.

The timing control circuit 470 may control the I I/O sense amplifiers 286a, 286b, . . . , 286i and the I drivers 287a, 287b, . . . , 287i. The timing control circuit 470 may provide an I/O sense enable signal IOSA_EN to the I/O sense amplifiers 286a, 286b, 286i in a read operation and may provide a driving signal PDT to the I drivers 287a, 287b, . . . , 287i. The first row decoder 260a may include a row block information circuit 700 and the row block information circuit 700 may include a plurality of row block fuse circuits 701, 702, . . . , 70J corresponding to the plurality of row blocks in the second direction D2. The row block fuse circuits 701, 702, . . . , 70J may output the row block information signal RBIN to the timing control circuit 470 in response to the row block identity bits of the row address SRA.

The timing control circuit 470 may adjust the I/O sense enable signal IOSA_EN and the driving signal PDT based on the row block information signal RBIN. The first column decoder 270a may include a plurality of sub column decoders SCD1, SCD2, . . . , SCDI 851~85I. Each of the sub column decoders 851~85I may be connected to corresponding one of the sub array blocks. Each of the sub column decoders 851~85I may select column selection lines CSL. Each of the sub column decoders 851~85I may provide a local sense enable signal PLSAEN to a corresponding sub array block SCB.

Figure 9:
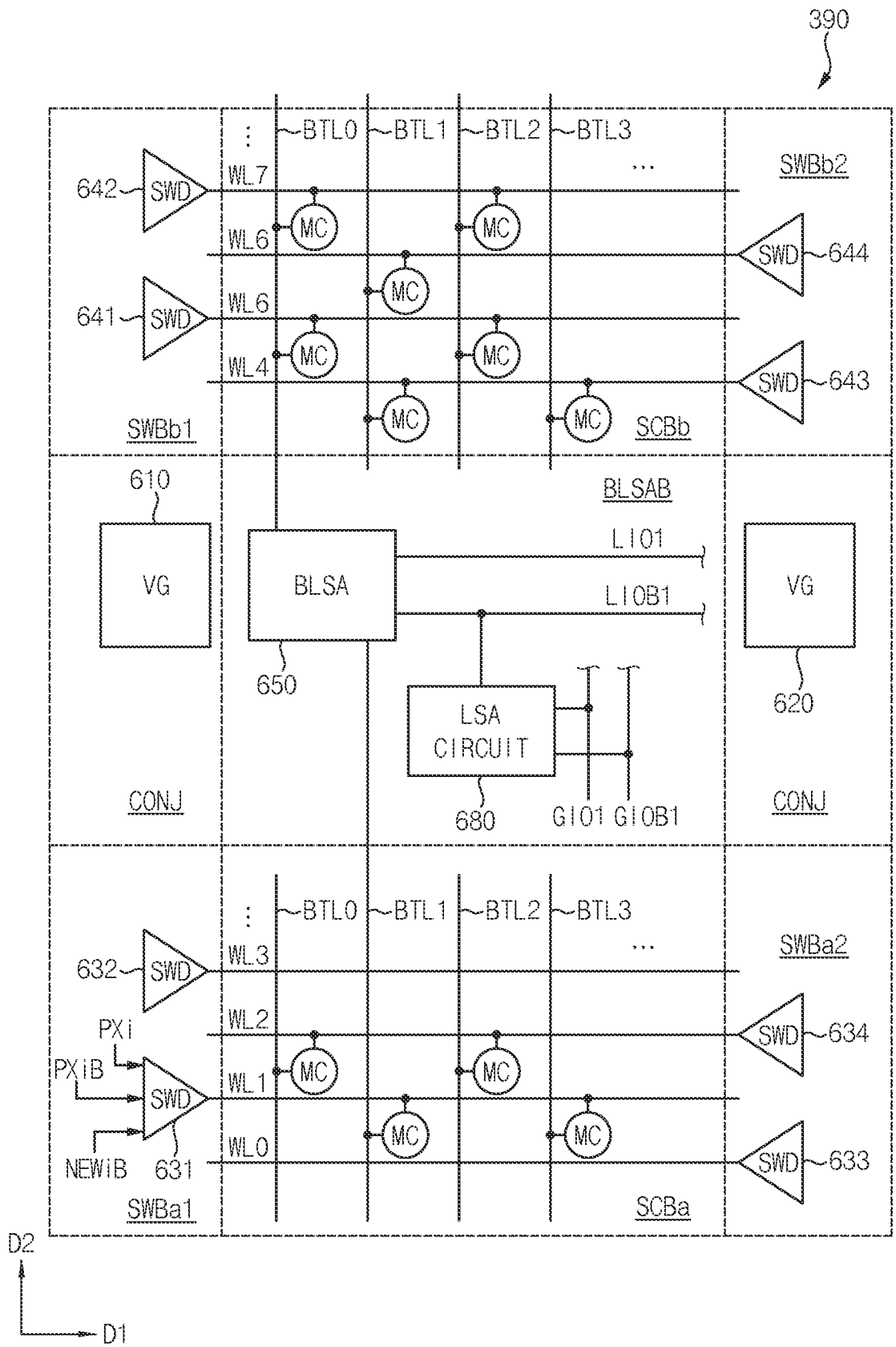
FIG. 9 illustrates a portion of the first bank array in FIG. 8 according to some example embodiments.

FIG. 9 illustrates a portion 390 of the first bank array 310a in FIG. 8 according to some example embodiments. Referring to FIGS. 8 and 9, in the portion 390 of the first bank array 310a, sub-array blocks SCBa and SCBb, the bit-line sense amplifier regions BLSAB, four sub word-line driver regions SWBa1, SWBa2, SWBb1 and SWBb2 and two of the conjunction regions CONJ are disposed.

The sub-array block SCBa may include a plurality of word-lines WL0~WL3 extending in the first direction D1 and a plurality of bit-line BTL0~BTL3 extending in the second direction D2. The sub-array block SCBa may include a plurality of memory cells MCs disposed at intersections of the word-lines WL0~WL3 and the bit-line BTL0~BTL3. The sub-array block SCBb may include a plurality of word-lines WL4~WL7 extending in the first direction D1 and the plurality of bit-line BTL0~BTL3 extending in the second direction D2. The sub-array block SCBb may include a plurality of memory cells MCs disposed at intersections of the word-lines WL4~WL7 and the bit-line BTL0~BTL3.

With reference to FIG. 9, the sub word-line driver regions SWBa1 and SWBa2 may include a plurality of sub word-line drivers 631, 632, 633 and 634 that respectively drive the word-lines WL0~WL3. The sub word-line driver regions SWBb1 and SWBb2 may include a plurality of sub word-line drivers 641, 642, 643 and 644 that respectively drive the word-lines WL4~WL7. The sub word-line driver 641 may control a voltage level of the word-line WL1 in response to the first and second word-line control signals PXi and PXiB. Each of the plurality of sub word-line drivers 632, 633, 634, 641, 642, 643 and 644 may control a voltage level of a corresponding word-line in response to the first and second word-line control signals PXi and PXiB.

The bit-line sense amplifier region BLSAB may include a bit-line sense amplifier BLSA 650 coupled to the bit-line BTL0 in the sub array block SCBb and the bit-line BTL1 in the sub array block SCBa, and a local sense amplifier LSA circuit 680. The bit-line sense amplifier 650 may sense and amplify a voltage difference between the bit-lines BTL0 and BTL1 to provide the amplified voltage difference to a local I/O line pair LIO1 and LIOB1. The local sense amplifier circuit 680 may control electrical connection between the local I/O line pair LIO1 and LIOB1 and a global I/O line pair GIO1 and GIOB1.

As illustrated in FIG. 9, the conjunction regions CONJ may be disposed adjacent to the bit-line sense amplifier region BLSAB and the sub word-line driver regions SWBa1, SWBb1, SWBa2 and SWBb2. Voltage generators 610 and 620 may be disposed in the conjunction regions CONJ.

Figure 10:
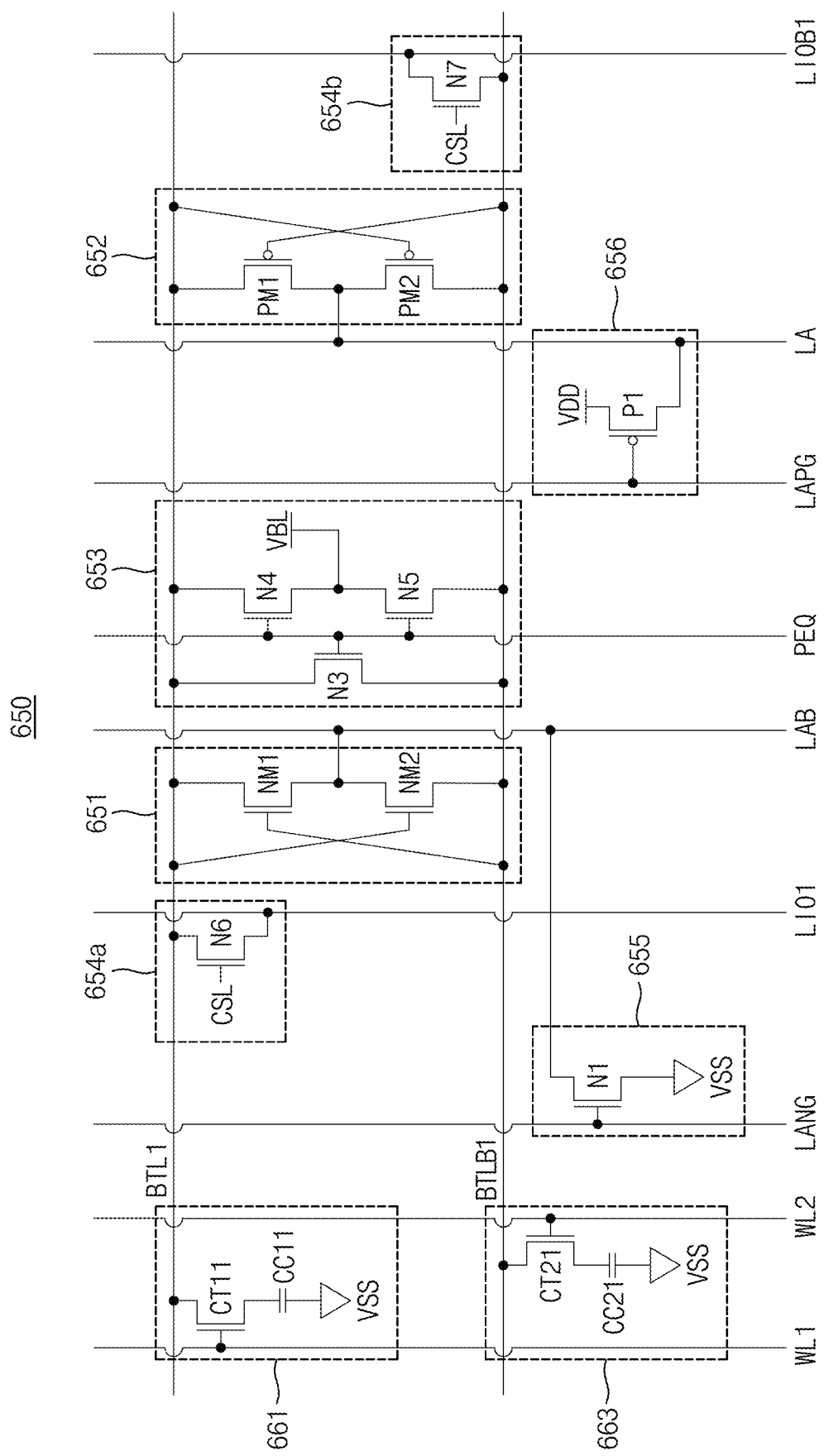
FIG. 10 is a circuit diagram illustrating the bit-line sense amplifier in FIG. 9 according to example embodiments.

FIG. 10 is a circuit diagram illustrating the bit-line sense amplifier in FIG. 9 according to example embodiments. Referring to FIG. 10, the bit-line sense amplifier 650 is coupled to bit-lines BTL1 and BTLB1 of each of memory cells 661 and 663 in the memory cell array 310. Memory cell 661 may correspond to the memory cell MC of sub-array block SCB that is at the intersection of bit-line BTL1 and word-line WL1, and memory cell 663 may correspond to the memory cell MC of sub-array block SCB that is located at the intersection of bit-line BTLB1 and word-line WL2. The bit-line sense amplifier 650 shown in FIG. 10 includes an N-type sense amplifier 651, a P-type sense amplifier 652, a pre-charge circuit 653, column select switches 654a and 654b, an N-type sense amplifier (NSA) driver 655, and a P-type sense amplifier (PSA) driver 656.

The N-type sense amplifier 651 discharges a low-level bit-line of the bit-lines (or bit-line pair) BL1 and BLB1 to a low level during a sensing operation. The N-type sense amplifier 651 includes two NMOS transistors NM1 and NM2. A gate of the NMOS transistor NM1 is connected to the bit-line (second bit-line) BTLB1, and a drain of the NMOS transistor NM1 is connected to the bit-line (first bit-line) BL1, and a source of the NMOS transistor NM1 is connected to a sense enable line LAB. The NMOS transistor NM2 has a gate connected to the bit-line BL1, a drain connected to the sense enable line LAB, and a source connected to the bit-line BLB1. The N-type sense amplifier 651 connects a low-level bit-line to the sense enable line LAB. The sense enable line LAB is connected to the ground voltage VSS.

The P-type sense amplifier 652 charges a high-voltage bit-line of the bit-lines BL1 and BLB1 with a power supply voltage VDD level at a sensing operation. The P-type sense amplifier 652 includes two PMOS transistors PM1 and PM2. The PMOS transistor PM1 has a gate connected to the bit-line BTLB1, a source connected to the bit-line BL1, and a drain connected to a sense enable line LA. The PMOS transistor PM2 has a gate connected to the bit-line BTL1, a source connected to sense enable line LA, and a drain connected to the bit-line BTLB1.

The P-type sense amplifier 652 charges a high-voltage bit-line of the bit-lines BTL1 and BTLB1 with a power supply voltage VDD provided to the sense enable line LA. The PSA driver 656 provides a charging voltage VDD to the sense enable line LA. Therefore, the transistor PM2 is turned off because the gate of the transistor PM2 is coupled to the bit-line BTL1 with a voltage increased by the charge sharing.

The pre-charge circuit 653 pre-charges the bit-lines BTL1 and BTLB1 with a half voltage VDD/2 in response to a control signal PEQ in sensing operation. When the control signal PEQ is activated, the pre-charge circuit 653 supplies a bit-line pre-charge voltage VBL to the bit-lines BTL1 and BTLB1. The bit-line pre-charge voltage VBL may be a half voltage VDD/2. The bit-lines BTL1 and BTLB1 are connected such that their voltages are equalized. If the bit-lines BTL1 and BTLB1 are charged by the pre-charge level VBL, the control signal PEQ is inactivated. The pre-charge circuit 653 includes NMOS transistors N3, N4, and N5.

The column select switches 654a and 654b provide data sensed by the N-type and P-type sense amplifiers 651 and 652 to local I/O lines LIO1 and LIOB1 in response to a column selection signal CSL. The column select switches 654a and 654b are turned on such that the sensed data is transferred to the local I/O lines LIO1 and LIOB1. For example, in a read operation when sensing levels of the N-type and P-type sense amplifiers 651 and 652 are stabilized, a column selection signal CSL is activated. Then the column select switches 654a and 654b are turned on such that the sensed data is transferred to the local I/O line pair LIO1 and LIOB1. Voltages of the bit-lines BTL1 and BTLB1 are varied when charges of bit-lines BL1 and BLB1 are shared with the local I/O lines LIO1 and LIOB1. The column select switches 654a and 654b includes NMOS transistors N6 and N7, respectively.

The NSA driver 655 provides a driving signal to the sense enable line LAB of the N-type sense amplifier 651. Based on the control signal LANG, the NSA driver 655 grounds the sense enable line LAB. The NSA driver 655 includes the ground transistor N1 to control a voltage of the sense enable line LAB. The PSA driver 656 provides the charge voltage VDD to the sense enable line LA of the P-type sense amplifier 652. The PSA driver 656 includes the PMOS transistor P1 to control a voltage of the sense enable line LA. The control signals LAPG and LANG are complementary to each other.

Figure 11:
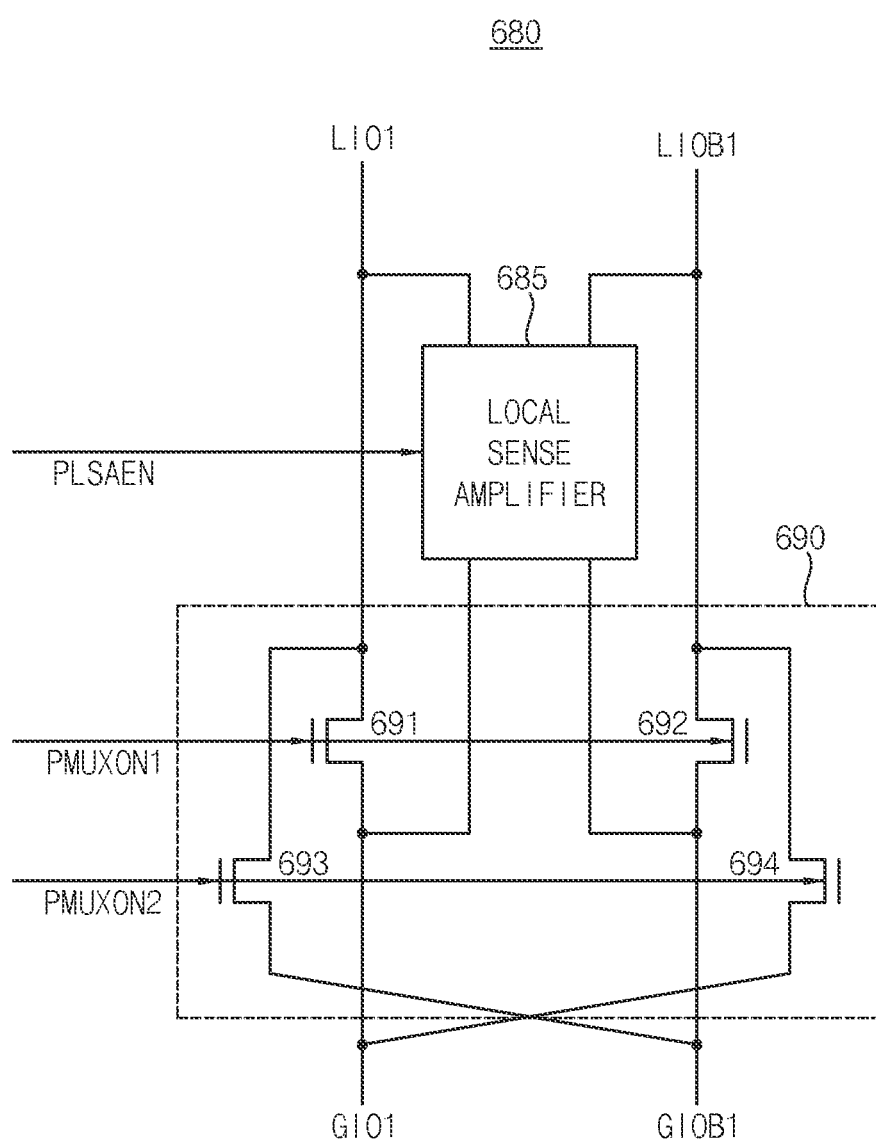
FIG. 11 illustrates an example of the local sense amplifier circuit in FIG. 9 according to example embodiments.

FIG. 11 illustrates an example of the local sense amplifier circuit in FIG. 9 according to example embodiments. Referring to FIG. 11, the local sense amplifier circuit 680 may include a local sense amplifier 685 and a local I/O line controller 690. The local sense amplifier 685 may amplify a voltage difference between the local I/O line pair LIO1 and LIOB1 in response to the local sense enable signal PLSAEN to provide the amplified voltage difference to a global I/O line pair GIO1 and GIOB1. The local I/O line controller 690 includes first through fourth NMOS transistors 691, 692, 693 and 694, and controls connection between the local I/O line pair LIO1 and LIOB1 and the global I/O line pair GIO1 and GIOB1 in response to a first connection control signal PMUXON1 and a second connection control signal PMUXON2.

For example, when each of the local sense enable signal PLSAEN, a first connection control signal PMUXON1, and a second connection control signal PMUXON2 is at a low level, the local sense amplifier 685 is disabled and the local I/O line controller 690 cuts off the connection between the local I/O line pair LIO1 and LIOB1 and the global I/O line pair GIO1 and GIOB1. And, when each of the local sense enable signal PLSAEN, the first connection control signal PMUXON1, and the second connection control signal PMUXON2 is a high level the local sense amplifier 685 is enabled and the local I/O line controller 690 provides the connection between the local I/O line pair LIO1 and LIOB1 and the global I/O line pair GIO1 and GIOB1.

Figure 12:
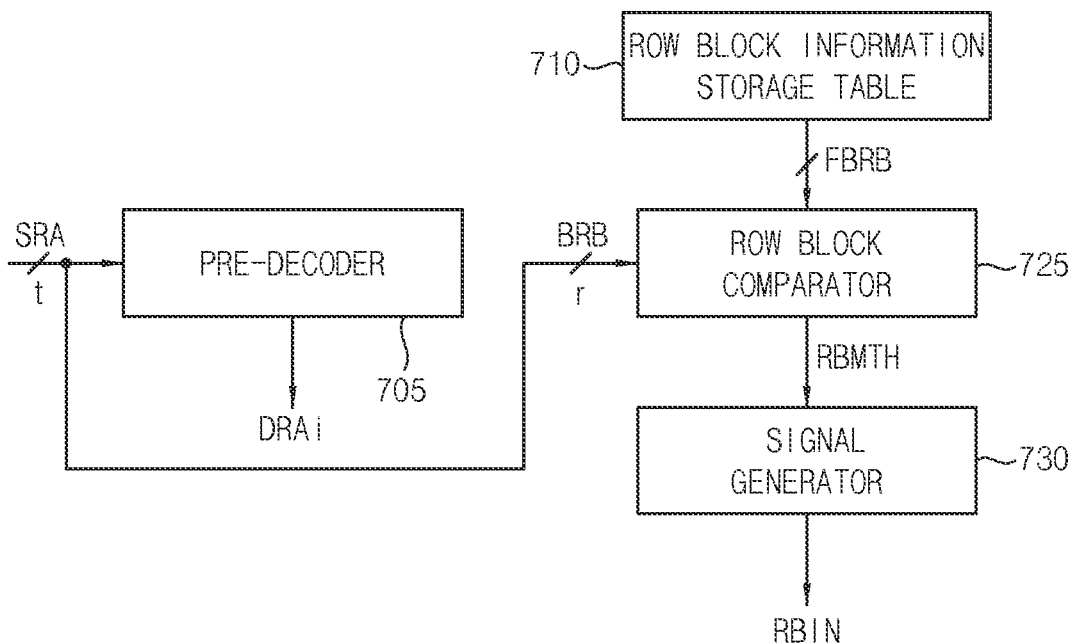
FIG. 12 is a block diagram illustrating a first row block fuse circuit of the row block fuse circuits in FIG. 8 according to example embodiments.

FIG. 12 is a block diagram illustrating a first row block fuse circuit of the row block fuse circuits in FIG. 8 according to example embodiments. Each configuration of the row block fuse circuits 702~70J may be substantially the same as a configuration of the first row block fuse circuit 701.

Referring to FIG. 12, the first row block fuse circuit 701 may include a pre-decoder 705, a row block information storage table 710, a row block address comparator 725 and a signal generator 730. The pre-decoder 705 decodes the row address SRA to provide the decoded row address DRAi to a corresponding sub word-line driver. The corresponding sub word-line driver may activate a word-line corresponding to the decoded row address DRAi, in response to the decoded row address DRAi.

The row block information storage table 710 may store defective row block address FBRB associated with a defective row block including the at least one defective cell. The row block information storage table 710 may provide the defective row block address FBRB to the row block address comparator 725 and the row block address comparator 725 may compare row block identity bits BRB with the defective row block address FBRB to provide the signal generator 730 with a row block match signal RBMTH indicating a result of the comparison of the row block identity bits with the defective row block address FBRB. When the row address SRA includes t-bit, upper r-bit of the row address SRA may correspond to the row block identity bits BRB. The signal generator 730 may provide the row block information signal RBIN to the timing control circuit 470 in response to the row block match signal RBMTH. The row block information signal RBIN may include repair information indicating that the corresponding row block includes at least one defective cell.

Figure 13:
FIG. 13 illustrates an example of the row address in FIG. 12.

FIG. 13 illustrates an example of the row address in FIG. 12. In FIG. 13, it is assumed that the row address SRA includes the 16-bits A0~A15. Referring to FIG. 13, the upper 3-bits A15~A13 of the row address SRA may be designated as the row block identity bits BRB. In this case, the sub array blocks SCB in FIG. 8 may be divided into eight row blocks disposed in the second direction D2.

Figure 14:
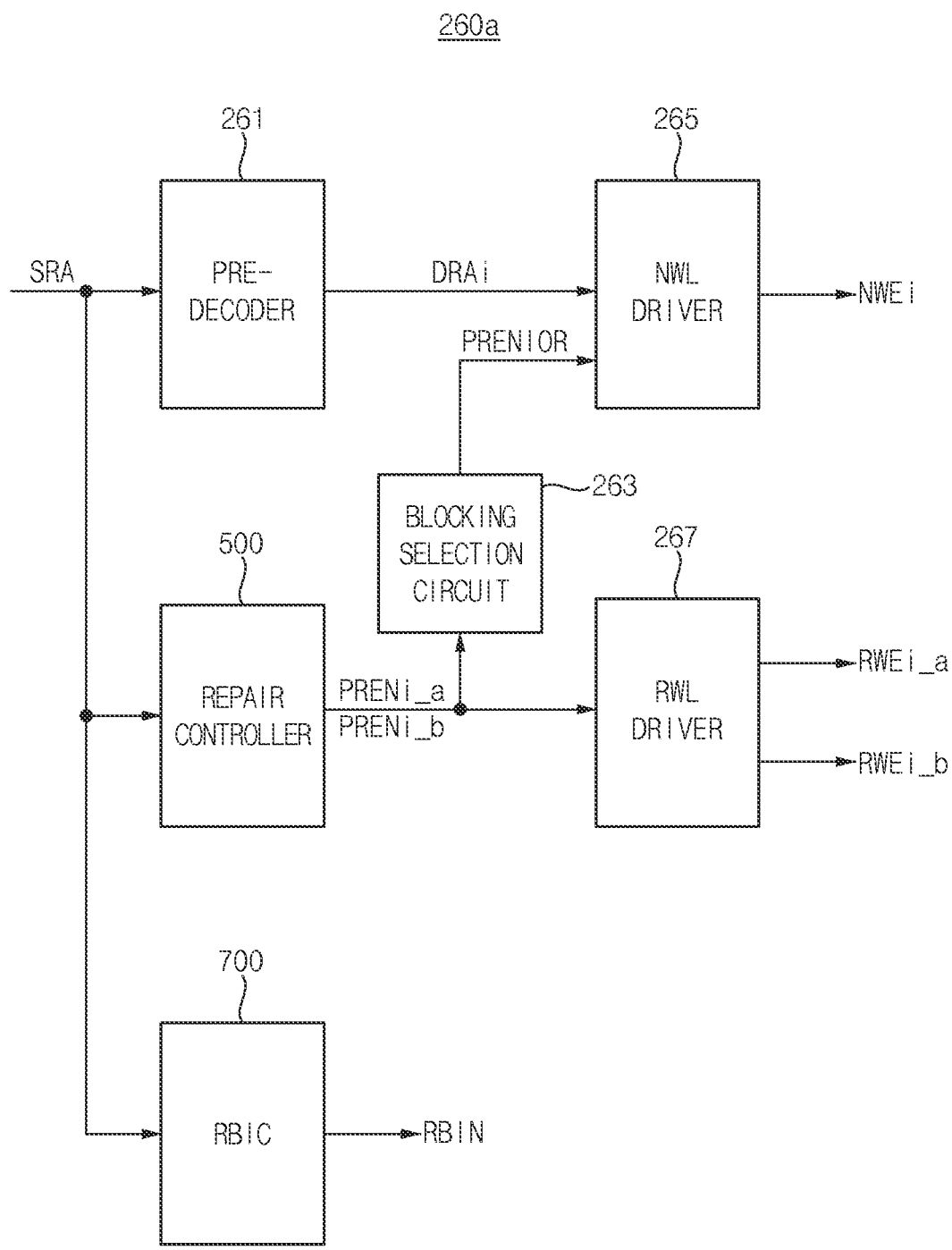
FIG. 14 is a block diagram illustrating an example of the first row decoder in FIG. 8 according to example embodiments.

FIG. 14 is a block diagram illustrating an example of the first row decoder in FIG. 8 according to example embodiments. Referring to FIG. 14, the first row decoder 260a may include a pre-decoder 261, the repair controller 500, a blocking selection circuit 263, a normal word-line NWL driver 265, a redundancy word-line RWL driver 267, and the row block information circuit (RBIC) 700.

The pre-decoder 261 may generate a decoded row address DRAi by decoding the access address SRA and may provide the decoded row address DRAi to the normal word-line driver 265. In another example embodiment, the pre-decoder 261 may not be included in the first row decoder 260a. The normal word-line driver 265 may activate a row address corresponding to the decoded row address DRAi based on the decoded row address DRAi. That is, the normal word-line driver 265 may generate a normal word-line enable signal NWEi that activates a row address corresponding to the decoded row address DRAi.

The repair controller 500 may receive the access address SRA, may generate a first redundancy enable signal PRENi_a that activates a first redundancy word-line replacing a first defective word-line designated by a first defective address based on comparing the access address SRA with the first defective address output from the fuse box, in a first mode, may generate a second redundancy enable signal PRENi_b that activates a second redundancy word-line replacing an edge word-line designated by the access address SRA based on comparing the access address SRA with a reset address output from the first fuse box, and may provide the redundancy word-line driver 267 and the blocking selection circuit 263 with the first redundancy enable signal PRENi_a and the second redundancy enable signal PRENi_b.

The blocking selection circuit 263 may generate a normal word-line blocking signal PRENIOR based on the first redundancy enable signal PRENi_a and the second redundancy enable signal PRENi_b and may selectively provide the normal word-line blocking signal PRENIOR to the normal word-line driver 265. The blocking selection circuit 263 may disable the normal word-line driver 265 by activating the normal word-line blocking signal PRENIOR when the first redundancy enable signal PRENi_a is activated or the second redundancy enable signal PRENi_b is activated.

The redundancy word-line driver 267 may activate the first redundancy word-line by activating a first redundancy word-line enable signal RWEi_a based on the first redundancy enable signal PRENi_a, in the first mode, and may activate the second redundancy word-line by activating a second redundancy word-line enable signal RWEi_b based on the second redundancy enable signal PRENi_b, in the second mode.

The row block information circuit 700 may generate the row block information signal RBIC based on the access address SRA.

Figure 15:
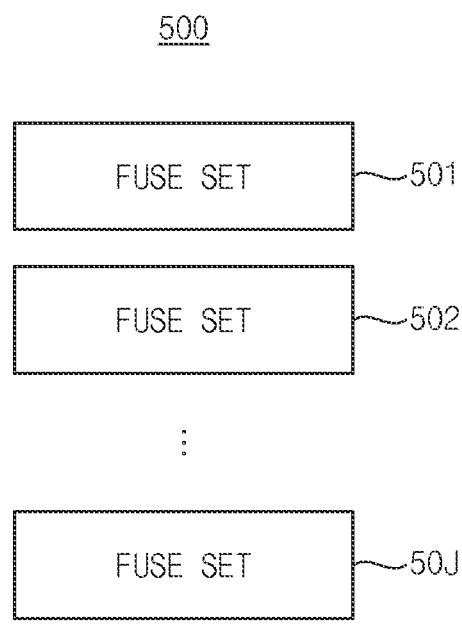
FIG. 15 is a block diagram illustrating an example of the repair controller in FIG. 14 according to example embodiments.

FIG. 15 is a block diagram illustrating an example of the repair controller in FIG. 14 according to example embodiments. Referring to FIG. 15, the repair controller 500 may include a plurality of fuse sets 501, 502, ..., 50J corresponding to the row blocks in FIG. 8. In example embodiment, each of the plurality of fuse sets 501, 502, ..., 50J may be included in respective one of the plurality of row block fuse circuits 701, 702, ..., 70J in FIG. 8.

Figure 16:
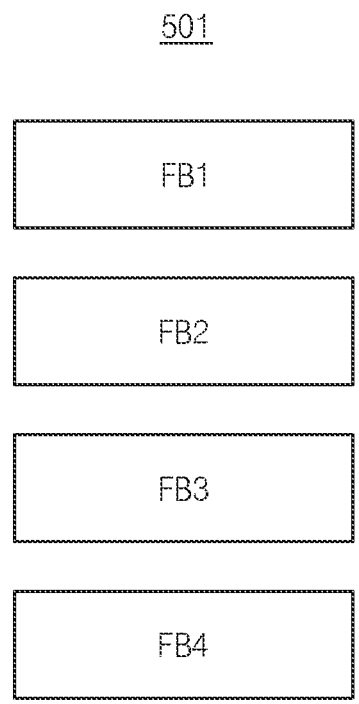
FIG. 16 is a block diagram illustrating a first fuse set from among the plurality of fuse sets in FIG. 15 according to example embodiments.

FIG. 16 is a block diagram illustrating a first fuse set from among the plurality of fuse sets in FIG. 15 according to example embodiments. Referring to FIG. 16, a first fuse set 501 may include a plurality of fuse boxes FB1, FB2, FB3 and FB4. Although not illustrated, each of the fuse sets 502, ..., 50J may include a plurality of fuse boxes.

Figure 17:
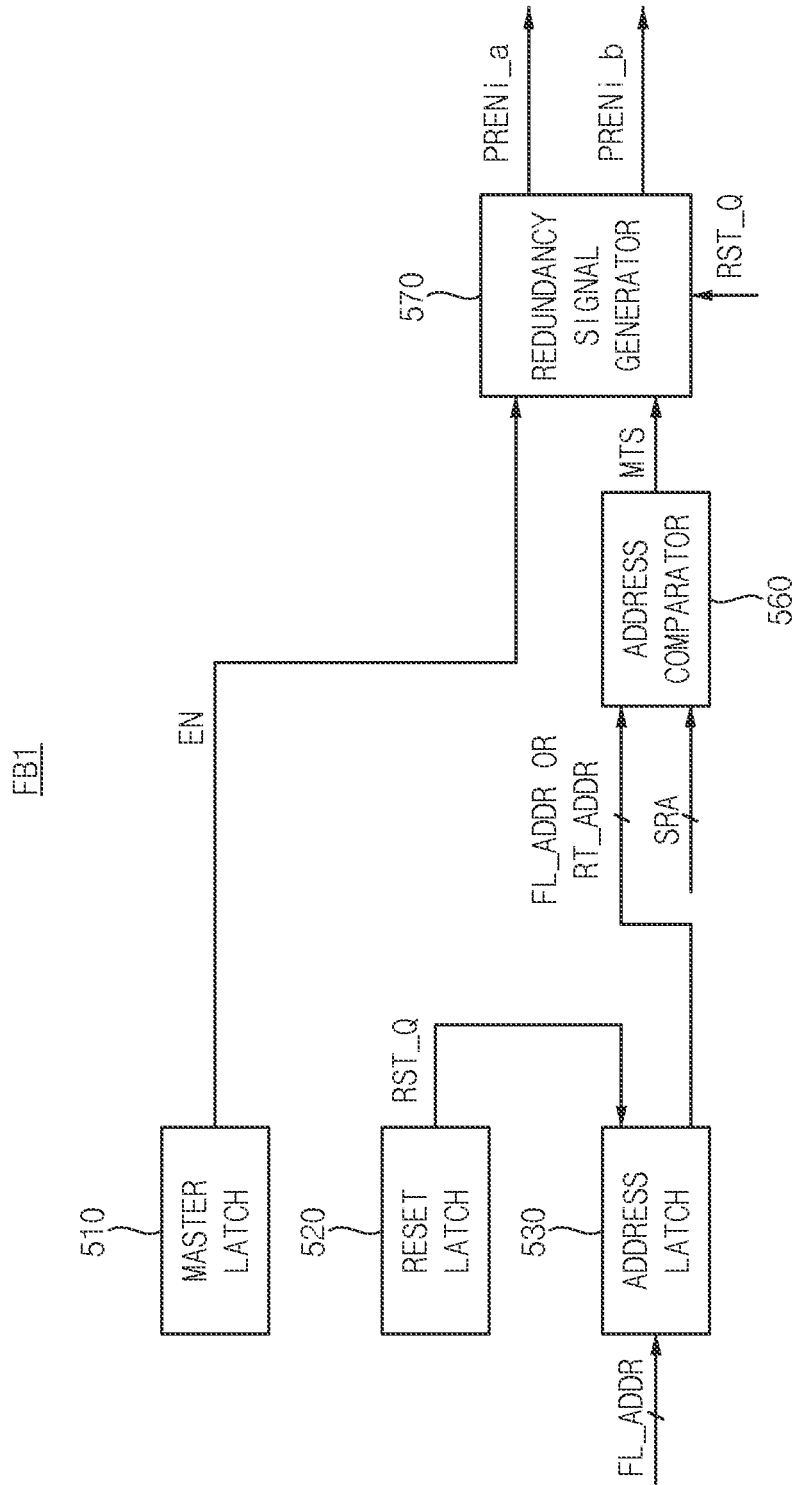
FIG. 17 is a block diagram illustrating a first fuse box from among the plurality of fuse boxes in FIG. 16 according to example embodiments.

FIG. 17 is a block diagram illustrating a first fuse box from among the plurality of fuse boxes in FIG. 16 according to example embodiments. Referring to FIG. 17, a first fuse box FB1 may include a master latch 510, a reset latch 520, an address latch 530, an address comparator 560 and a redundancy signal generator 570.

The master latch 510 may generate an enable signal EN that is activated in a first mode and a second mode of a repair operation. The reset latch 520 may generate a reset signal RST_Q that has a first logic level (i.e., a logic low level) in the first mode and has a second logic level (i.e., a logic high level) different from the first logic level in the second mode.

The control logic circuit 210 in FIG. 3 may provide the mater latch 510 and the reset latch 520 with a signal (i.e., a mode signal) designating one of the first mode and the second mode. The address latch 530 may receive a defective address FL_ADDR to store the defective address FL_ADDR. The address latch 530 may output the defective address FL_ADDR to the address comparator 560 in the first mode and output a reset address RT_ADDR to the address comparator 560 by being reset in the second mode, in response to the reset signal RST_Q.

The address comparator 560 may output a matching signal MTS to the redundancy signal generator 570 by comparing the access address SRA with an output of the address latch 530. In the first mode, the address comparator 560 may compare the access address SRA with the defective address FL_ADDR to output the matching signal MTS indicating whether the access address SRA matches the defective address FL_ADDR to the redundancy signal generator 570. In the second mode, the address comparator 560 may compare the access address SRA with the reset address RT_ADDR to output the matching signal MTS indicating whether the access address SRA matches the reset address RT_ADDR to the redundancy signal generator 570.

The redundancy signal generator 570 may generate the first redundancy enable signal PRENi_a that activates the first redundancy word-line in the first mode (that is, when the access address SRA matches the defective address FL_ADDR) and may generate the second redundancy enable signal PRENi_b that activates the second redundancy word-line in the second mode (that is, when the access address SRA matches the reset address RT_ADDR) based on the enable signal EN, the reset signal RST_Q and the matching signal MTS.

Therefore, the repair controller 500 may activate the first redundancy word-line replacing the first defective word-line designated by defective address FL_ADDR when the access address SRA matches the defective address FL_ADDR in the first mode) and may activate the second redundancy word-line replacing an edge word-line designated by the access address SRA when the access address SRA matches the reset address RT_ADDR in the second mode. Accordingly, the address latch 530 is reset by the reset signal RST_Q in the second mode and may output the reset address RT_ADDR that forcibly designates the edge word-line instead of outputting the defective address FL_ADDR.

FIG. 18 is a state table illustrating an example operation of the first fuse box of FIG. 17 according to example embodiments. Referring to FIGS. 17 and 18, when the enable signal EN has a first logic level, the address latch 530 does not operate. When the enable signal EN has a second logic level and the reset signal RST_Q has a second logic level, the address latch 530 outputs the reset address RT_ADDR that forcibly designates the edge word-line. When the enable signal EN has a second logic level and the reset signal RST_Q has a first logic level, the address latch 530 outputs defective address FL_ADDR stored therein which designates the defective word-line.

Figure 19:
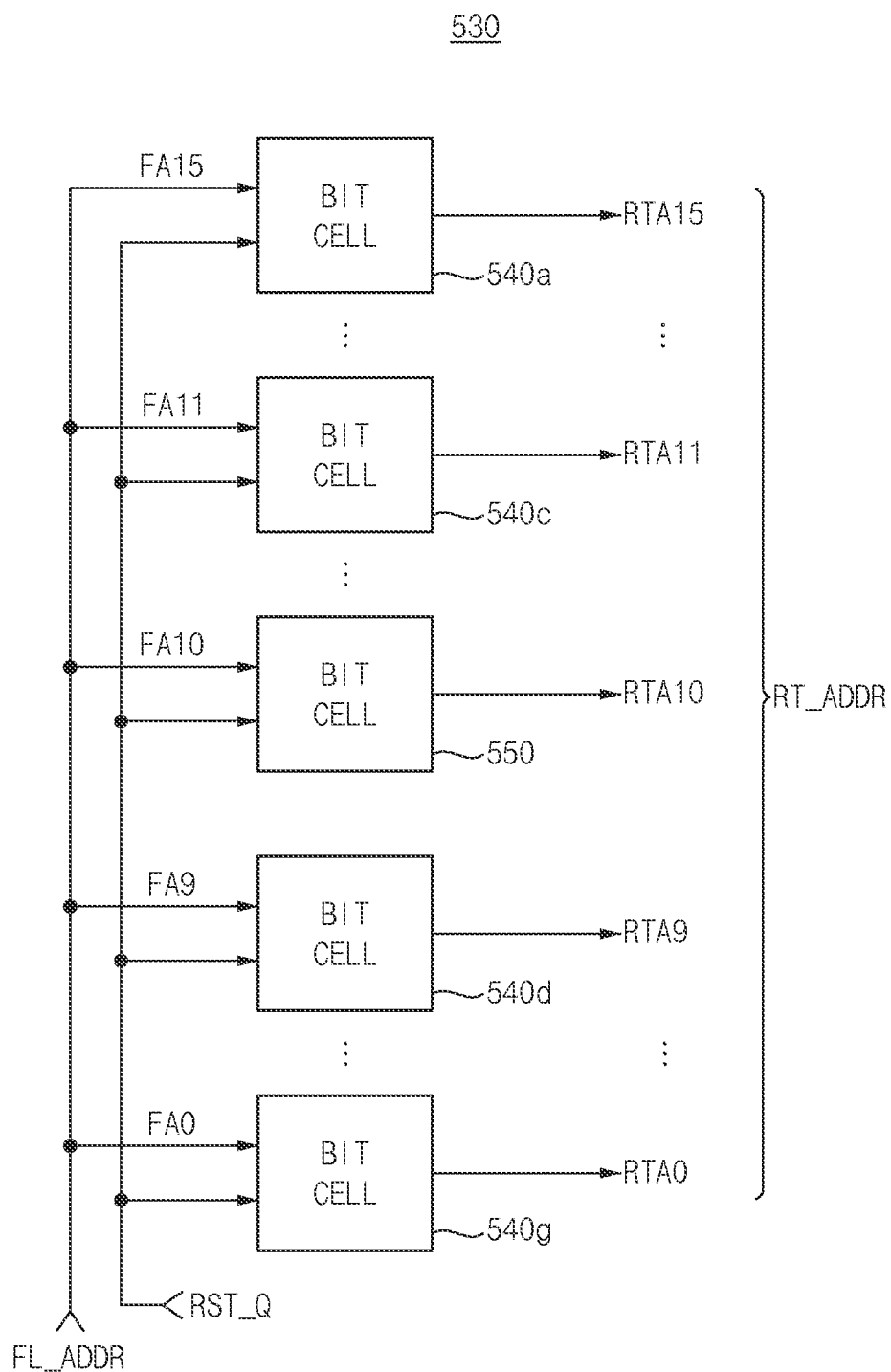
FIG. 19 is a block diagram illustrating an example of the first fuse box in FIG. 17 according to example embodiments.

FIG. 19 is a block diagram illustrating an example of the first fuse box in FIG. 17 according to example embodiments. Referring to FIG. 19, the address latch 530 may include a plurality of first bit cells 540a, ..., 540c, 540d, ..., 540g and a second bit cell 550. The first bit cells 540a, ..., 540c, 540d, ..., 540g may store first bits FA15, ..., FA11, FA9, ..., FA0, respectively, from among a plurality of address bits FA15, ..., FA11, FA10, FA9, ..., FA0 of the defective address FL_ADDR and the second bit cell 550 may store a second bit FA10 from among the plurality of address bits FA15, . . . , FA11, FA10, FA9, . . . , FA0 of the defective address FL_ADDR.

The reset signal RST_Q is applied to the first bit cells 540a, . . . , 540c, 540d, . . . , 540g and the second bit cell 550. In the first mode, the first bit cells 540a, . . . , 540c, 540d, . . . , 540g are reset in response to the reset signal RST_Q having a first logic level, the second bit cell 550 is set in response to the reset signal RST_Q, and thus, the address latch 530 outputs the defective address FL_ADDR. In the second mode, the first bit cells 540a, . . . , 540c, 540d, . . . , 540g are set in response to the reset signal RST_Q having a second logic level, the second bit cell 550 is reset in response to the reset signal RST_Q, and thus, the address latch 530 outputs the reset address RT_ADDR. In the second mode, the first bit cells 540a, . . . , 540c, 540d, . . . , 540g may output address bits RTA15, . . . , RTA11, RTA9, . . . , RTA0 of the reset address RT_ADDR, respectively, and the second bit cell 550 may output an address bit RTA10 of the reset address RT_ADDR.

Figure 20:
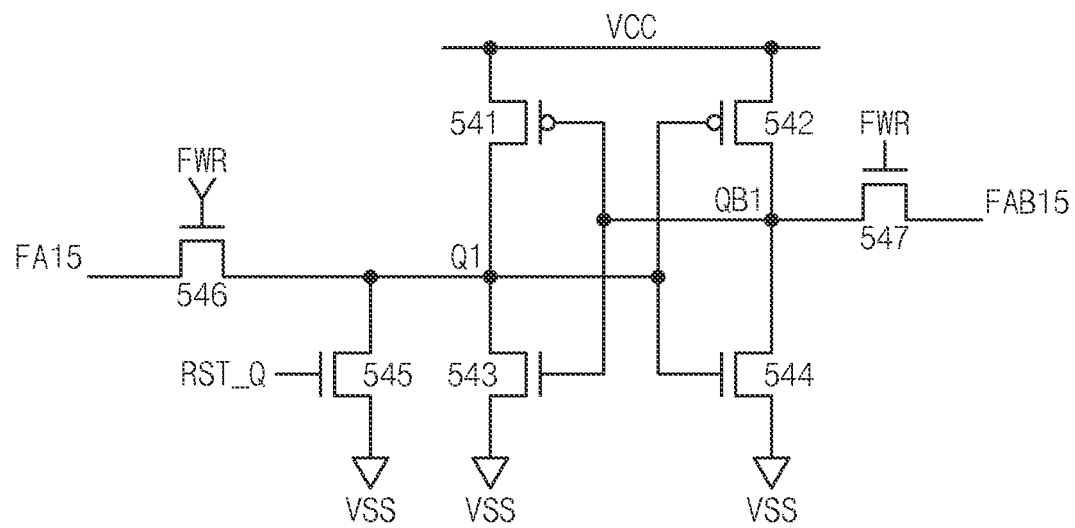
FIG. 20 illustrates one of the first bit cells in the address latch of FIG. 19 according to example embodiments.

FIG. 20 illustrates one of the first bit cells in the address latch of FIG. 19 according to example embodiments. Although a particular configuration of the first bit cell 540a is illustrated in FIG. 20, each configuration of the 540c, 540d, . . . , 540g is substantially the same as the configuration of the first bit cell 540a. Referring to FIG. 20, the first bit cell 540a may include first and second p-channel metal-oxide semiconductor (PMOS) transistors 541 and 542, first, second and third n-channel metal-oxide semiconductor (NMOS) transistors 543, 544 and 545, a first access transistor 546 and a second access transistor 547.

The first PMOS transistor 541 may be connected between a power supply voltage VCC and an output node Q1 and may have a gate connected to an inverted output node QB1. The first NMOS transistor 543 may be connected between the output node Q1 and a ground voltage VSS and may have a gate connected to the inverted output node QB1.

The second PMOS transistor 542 may be connected between the power supply voltage VCC and the inverted output node QB1 and may have a gate connected to the output node Q1. The second NMOS transistor 544 may be connected between the inverted output node QB1 and the ground voltage VSS and may have a gate connected to the output node Q1. The third NMOS transistor 545 may be connected between the output node Q1 and the ground voltage VSS in parallel with the first NMOS transistor 543 and may have a gate receiving the reset signal RST_Q.

The first access transistor 546 may transfer the address bit FA15 of the defective address FL_ADDR to the output node Q1 based on a write control signal FWR. The second access transistor 547 may transfer an inverted address bit FAB15 of the defective address FL_ADDR to the inverted output node QB1 based on the write control signal FWR. The third NMOS transistor 545, in the second mode, may reset the output node Q1 by connecting the ground voltage to the output node Q1 in response to the reset signal RST_Q having a second logic level. When the output node Q1 is reset, a value output from the output node Q1 is 'zero' corresponding to the first logic level instead of the address bit FA15. When the output node Q1 is reset, the inverted output node QB1 may be set.

Figure 21:
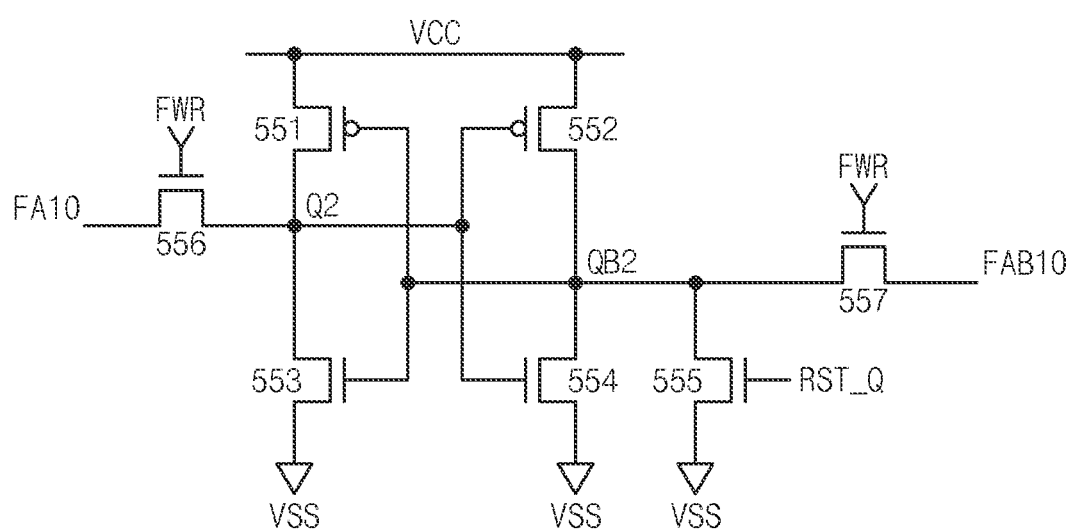
FIG. 21 illustrates the second bit cell in the address latch of FIG. 19 according to example embodiments.

FIG. 21 illustrates the second bit cell in the address latch of FIG. 19 according to example embodiments. Referring to FIG. 21, the second bit cell 550 may include first and second PMOS transistors 551 and 552, first, second and third NMOS transistors 553, 554 and 555, a first access transistor 556 and a second access transistor 557.

The first PMOS transistor 551 may be connected between the power supply voltage VCC and an output node Q2 and may have a gate connected to an inverted output node QB2. The first NMOS transistor 553 may be connected between the output node Q2 and the ground voltage VSS and may have a gate connected to the inverted output node QB2.

The second PMOS transistor 552 may be connected between the power supply voltage VCC and the inverted output node QB2 and may have a gate connected to the output node Q2. The second NMOS transistor 554 may be connected between the inverted output node QB2 and the ground voltage VSS and may have a gate connected to the output node Q2. The third NMOS transistor 555 may be connected between the inverted output node QB2 and the ground voltage VSS in parallel with the second NMOS transistor 554 and may have a gate receiving the reset signal RST_Q.

The first access transistor 556 may transfer the address bit FA10 of the defective address FL_ADDR to the output node Q2 based on the write control signal FWR. The second access transistor 557 may transfer an inverted address bit FAB10 the address bit FA10 of the defective address FL_ADDR to the inverted output node QB2 based on the write control signal FWR.

The third NMOS transistor 545, in the second mode, may reset the inverted output node QB2 by connecting the ground voltage to the inverted output node QB2 in response to the reset signal RST_Q having a second logic level. When the inverted output node QB2 is reset, a value output from the output node Q2 corresponds to a second logic level instead of the address bit FA10. In addition, when the inverted output node QB2 is reset, the output node Q2 may be set.

Figure 22:
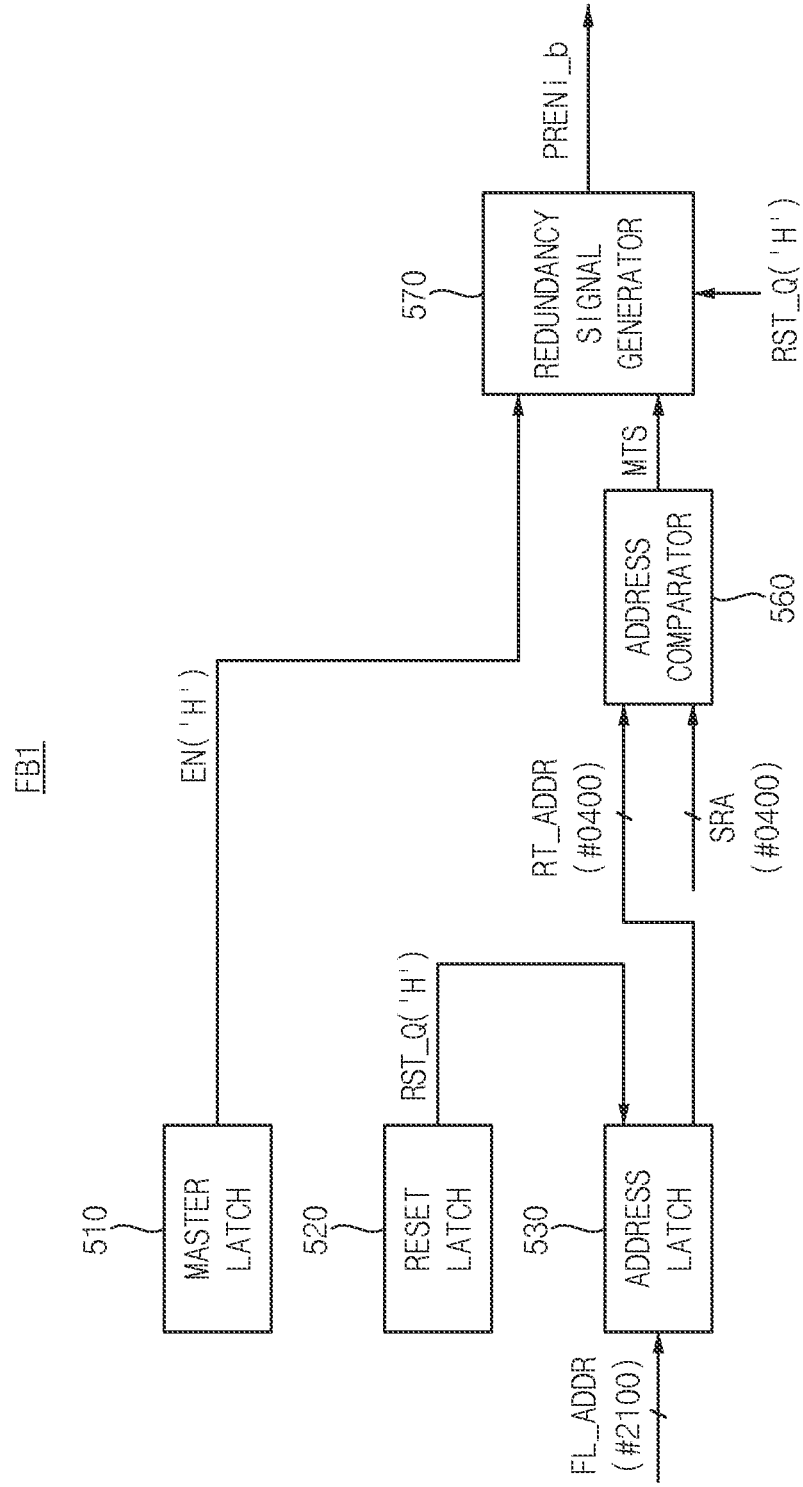
FIG. 22 illustrates an example operation of the first fuse box in FIG. 17 in the second mode according to example embodiments.

FIG. 22 illustrates an example operation of the first fuse box in FIG. 17 in the second mode according to example embodiments. Referring to FIG. 22, in the second mode, when the enable signal EN has a second logic level ('H') and the reset signal RST_Q has a second logic level ('H'), the address latch 530 receives and stores the defective address FL_ADDR corresponding to '#2100' and the address comparator 560 receives the access address SRA corresponding to an edge word-line of '#0400'. Hereinafter, the symbol '#' indicates that addresses are represented in hexa-code format.

The address latch 530, in response to the reset signal RST_Q having a second logic level ('H'), outputs the reset address RT_ADDR corresponding to '#0400' instead of the defective address FL_ADDR corresponding to '#2100' to the address comparator 560, and the address comparator 560 provides the redundancy signal generator 570 with the matching signal MTS indicating that the access address SRA matches the reset address RT_ADDR. The redundancy signal generator 570 generates the second redundancy enable signal PRENi_b that activates the second redundancy word-line in response to the reset signal RST_Q having a second logic level ('H') and the matching signal MTS.

Figure 23:
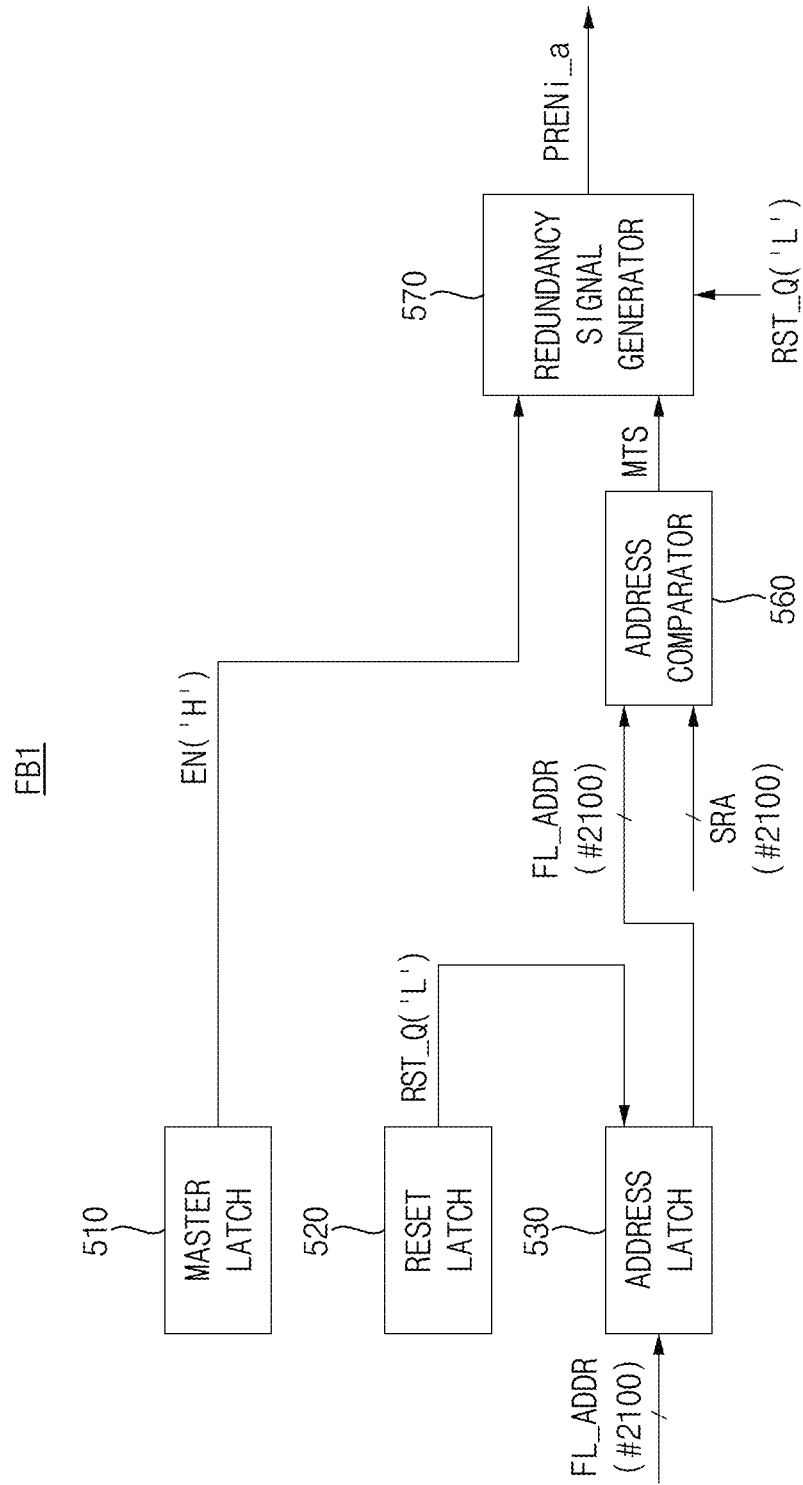
FIG. 23 illustrates an example operation of the first fuse box in FIG. 17 in the first mode according to example embodiments.

FIG. 23 illustrates an example operation of the first fuse box in FIG. 17 in the first mode according to example embodiments. Referring to FIG. 23, in the first mode, when the enable signal EN has a first logic level ('L') and the reset signal RST_Q has a first logic level ('L'), the address latch 530 receives and stores the defective address FL_ADDR corresponding to '#2100' and the address comparator 560 receives the access address SRA corresponding to a defective word-line of '#2100'.

The address latch 530, in response to the reset signal RST_Q having a first logic level ('L'), outputs the defective address FL_ADDR corresponding to '#2100' to the address comparator 560, and the address comparator 560 provides the redundancy signal generator 570 with the matching signal MTS indicating that the access address SRA matches the defective address FL_ADDR. The redundancy signal generator 570 generates the first redundancy enable signal PRENi_a that activates the first redundancy word-line in response to the reset signal RST_Q having a first logic level ('L') and the matching signal MTS.

Figure 24:
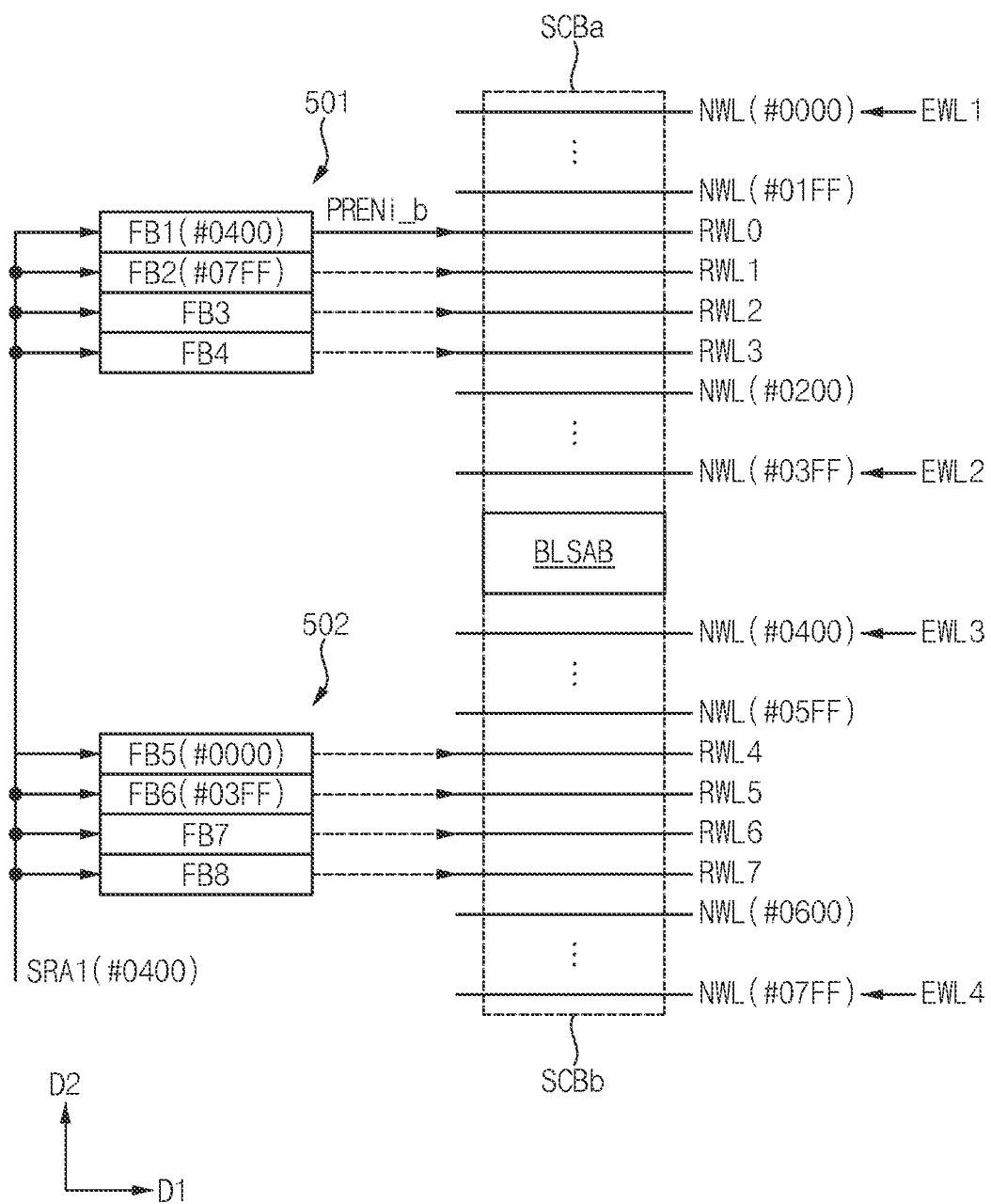
FIG. 24 illustrates a repair operation of the semiconductor memory device of FIG. 3 according to example embodiments.

FIG. 24 illustrates a repair operation of the semiconductor memory device of FIG. 3 according to example embodiments. In FIG. 24, the first sub array block SCBa and the second sub array block SCBb in FIG. 9 and the first fuse set 501 and the second fuse set 502 in FIG. 15 are illustrated. The first sub array block SCBa and the second sub array block SCBb are arranged in the second direction D2 with respect to a bit-line sense amplifier region BLSAB, the first sub array block SCBa may include normal word-lines NWL (#0000), . . . , NWL(#01FF), NWL(#0200), . . . , NWL (#03FF) and redundancy word-line RWL0, RWL1, RWL2 and RWL3 disposed between the normal word-lines NWL (#01FF) and NWL(#0200), the normal word-line NWL (#0000) may correspond to an edge word-line EWL1 disposed at a first edge (portion) of the first sub array block SCBa and the normal word-line NWL (#03FF) may correspond to an edge word-line EWL2 disposed at a second edge (portion) of the first sub array block SCBa.

The second sub array block SCBb may include normal word-lines NWL(#0400), . . . , NWL(#05FF), NWL(#0600), . . . , NWL(#07FF) and redundancy word-line RWL4, RWL5, RWL5 and RWL7 disposed between the normal word-lines NWL(#05FF) and NWL(#0600), the normal word-line NWL (#0400) may correspond to an edge word-line EWL3 disposed at a first edge (portion) of the second sub array block SCBb and the normal word-line NWL (#07FF) may correspond to an edge word-line EWL4 disposed at a second edge (portion) of the second sub array block SCBb.

The first fuse set 501 may include the fuse boxes FB1, FB2, FB3 and FB4 and the second fuse set 502 may include the fuse boxes FB5, FB6, FB7 and FB8. In addition, a first access address SRA1 corresponding to '#0400' is input to the fuse boxes FB1, FB2, FB3 and FB4 and the fuse boxes FB5, FB6, FB7 and FB8.

The fuse box FB1, in the second mode, may generate a second redundancy enable signal PRENi_b that activates a first redundancy word-line RWL0 replacing a first edge word-line EWL3 corresponding to '#0400' and the first edge word-line EWL3 may be repaired with the first redundancy word-line RWL0. In contrast, the fuse box FB2 in the second mode, may output a reset address the activate a redundancy word-line RWL1 replacing an edge word-line EWL4 corresponding to '#07FF', fuse box FB5 in the second mode, may output a reset address the activate a redundancy word-line RWL4 replacing an edge word-line EWL1 corresponding to '#0000' and the fuse box FB6 in the second mode, may output a reset address the activate a redundancy word-line RWL5 replacing an edge word-line EWL2 corresponding to '#03FF'. Although not illustrated, one of the fuse boxes FB5, FB6, FB7 and FB8, in the second mode, may generate a second redundancy enable signal that activates one of the redundancy word-lines RWL4, RWL5, RWL6 and RWL7, which replace the edge word-line EWL4 corresponding to '#0400'.

Figure 25:
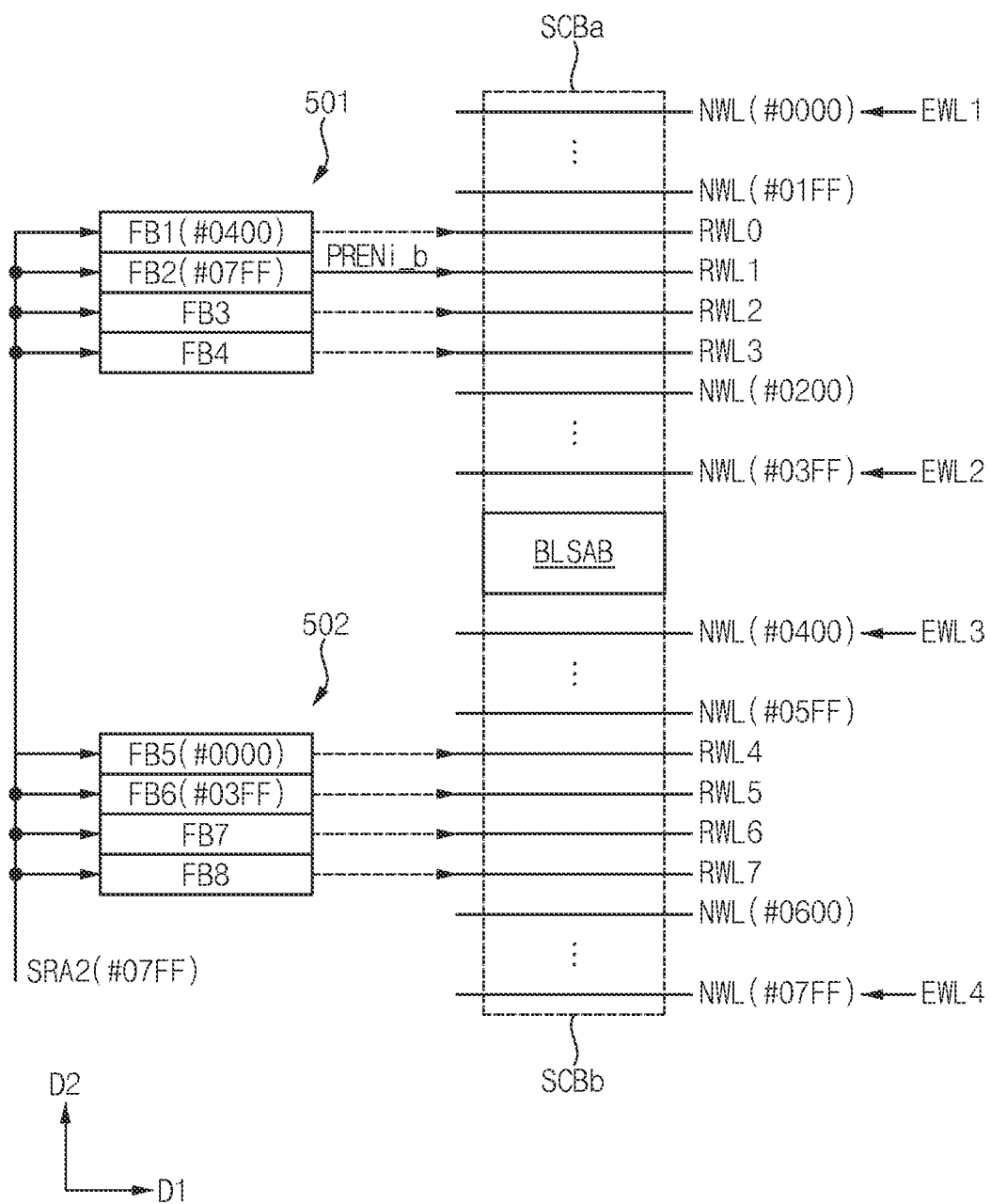
FIG. 25 illustrates a repair operation of the semiconductor memory device of FIG. 3 according to example embodiments.

FIG. 25 illustrates a repair operation of the semiconductor memory device of FIG. 3 according to example embodiments. In FIG. 25, descriptions repeated with FIG. 24 will be omitted. Referring to FIG. 25, a second access address SRA2 corresponding to '#07FF' is input to the fuse boxes FB1, FB2, FB3 and FB4 and the fuse boxes FB5, FB6, FB7 and FB8. The fuse box FB2, in the second mode, may generate a second redundancy enable signal PRENi_b that activates a fourth redundancy word-line RWL1 replacing a fourth edge word-line EWL4 corresponding to '#07FF' and the fourth edge word-line EWL4 may be repaired with the fourth redundancy word-line RWL4.

Figure 26:
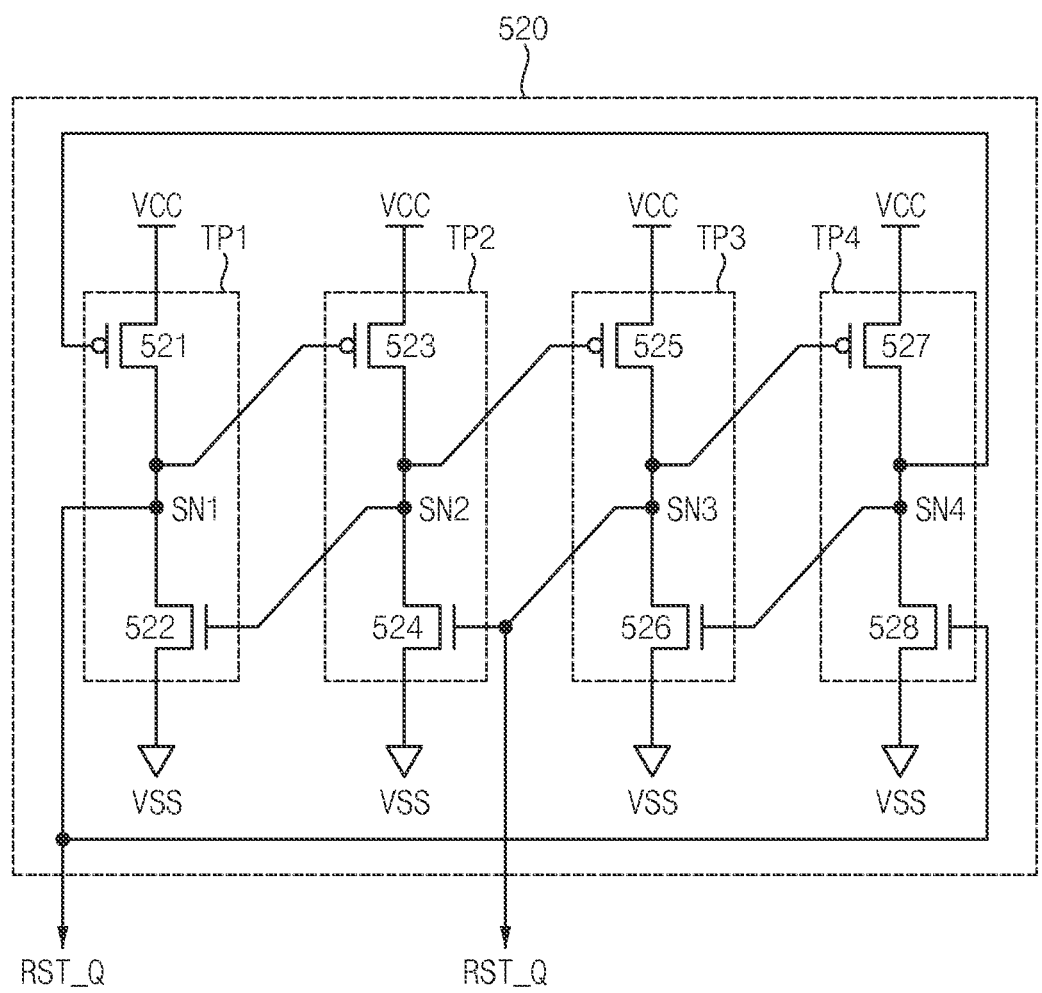
FIG. 26 is a block diagram illustrating a reset latch in the first fuse box of FIG. 17 according to example embodiments.

FIG. 26 is a block diagram illustrating a reset latch in the first fuse box of FIG. 17 according to example embodiments. Referring to FIG. 26, the reset latch 520 may include first to fourth transistor pairs TP1, TP2, TP3 and TP4. Each of the first to fourth transistor pairs TP1, TP2, TP3 and TP4 may include a PMOS transistor and an NMOS transistor connected in series through a corresponding one of first to fourth storage nodes SN1, SN2, SN3 and SN4. Each of the first to fourth storage nodes SN1, SN2, SN3 and SN4 may be connected to a gate of an NMOS transistor of a transistor pair in a previous stage and a gate of a PMOS transistor of a transistor pair in a next stage.

The first transistor pair TP1 may include a PMOS transistor 521 and an NMOS transistor 522. The PMOS transistor 521 may have a source coupled to a power supply voltage VCC, a gate coupled to the fourth storage node SN4 and a drain coupled to the first storage node SN1. The NMOS transistor 522 may have a drain coupled to the first storage node SN1, a gate coupled to the second storage node SN1 and a source coupled to a ground voltage VSS.

The second transistor pair TP2 may include a PMOS transistor 523 and an NMOS transistor 524. The PMOS transistor 523 may have a source coupled to the power supply voltage VCC, a gate coupled to the first storage node SN1 and a drain coupled to the second storage node SN2. The NMOS transistor 524 may have a drain coupled to the second storage node SN2, a gate coupled to the third storage node SN3 and a source coupled to the ground voltage VSS.

The third transistor pair TP3 may include a PMOS transistor 525 and an NMOS transistor 526. The PMOS transistor 525 may have a source coupled to the power supply voltage VCC, a gate coupled to the second storage node SN2 and a drain coupled to the third storage node SN3. The NMOS transistor 526 may have a drain coupled to the third storage node SN3, a gate coupled to the fourth storage node SN4 and a source coupled to the ground voltage VSS.

The fourth transistor pair TP4 may include a PMOS transistor 527 and an NMOS transistor 528. The PMOS transistor 527 may have a source coupled to the power supply voltage VCC, a gate coupled to the third storage node SN3 and a drain coupled to the fourth storage node SN4. The NMOS transistor 528 may have a drain coupled to the fourth storage node SN4, a gate coupled to the first storage node SN1 and a source coupled to the ground voltage VSS.

The reset signal RST_Q may be output from each of the first storage node SN1 and the third storage node SN3. The reset latch 520 may be implemented with a dual interlocked storage cell (DICE) and may have a strong resistance to soft errors in which data stored in the reset latch 520 changes unintentionally due to cosmic rays, such as alpha particles. The soft errors may be referred to as single event upsets (SEUs). The master latch 510 in the first fuse box FB1 in FIG. 17 may be implemented with a DICE.

Figure 27:
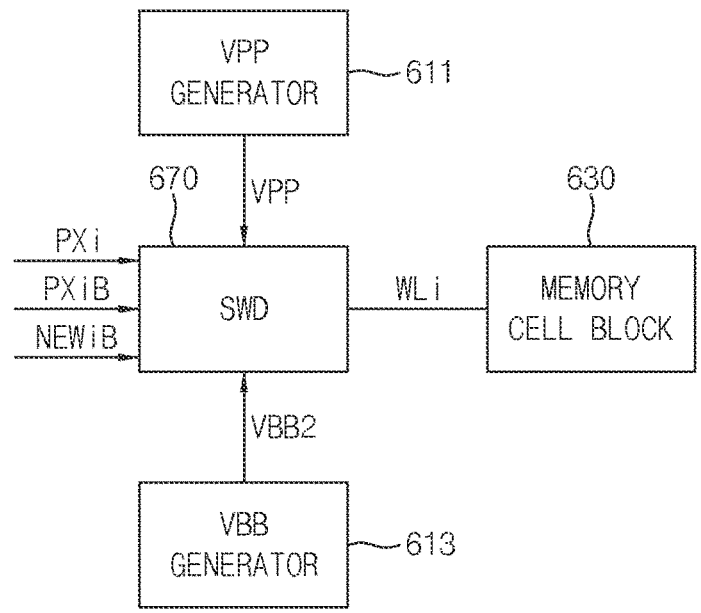
FIG. 27 illustrates a sub word-line driver and a memory cell block in FIG. 9 according to example embodiments.

FIG. 27 illustrates a sub word-line driver and a memory cell block in FIG. 9 according to example embodiments. Referring to FIG. 27, a boosted voltage generator 611 generates a boosted voltage VPP to the sub word-line driver SWD 670 and a negative voltage generator 613 generates a negative voltage VBB2 to the sub word-line driver 670. The sub word-line driver 670 may enable a word-line WLi with the boosted voltage VPP or disable the word-line WLi with the negative voltage VBB2 in response to the first and second word-line control signals PXi and PXiB and a normal word-line enable signal NEWiB. The word-line WLi may be coupled to a memory cell block 630.

Figure 28:
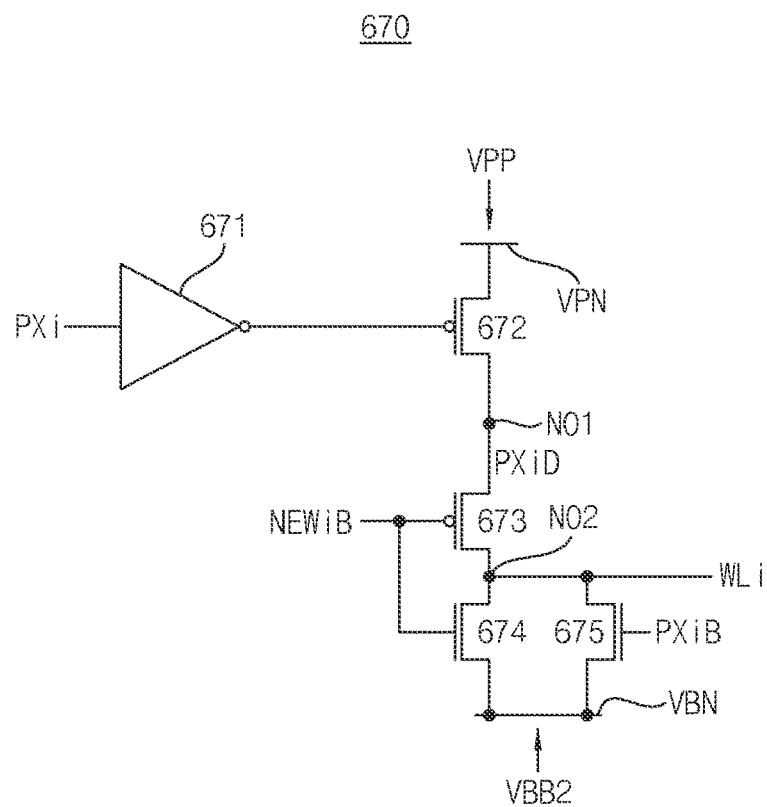
FIG. 28 is a circuit diagram illustrating an example of the sub word-line driver in FIG. 27 according to example embodiments.

FIG. 28 is a circuit diagram illustrating an example of the sub word-line driver in FIG. 27 according to example embodiments. Referring to FIG. 28, the sub word-line driver 670 includes an inverter 671, PMOS transistors 672 and 673, and NMOS transistors 674 and 675. The inverter 671 inverts the first word-line control signal PXi and is coupled to a gate of the PMOS transistor 672. The PMOS transistor 672 has a source connected to a boosted voltage terminal VPN, a gate receiving an output of the inverter 671 and a drain connected to a boosted node NO1. The PMOS transistor 673 has a source connected to the boosted node NO1, a gate receiving word-line enable signal NEWiB and a drain connected to an enable node NO2. The NMOS transistor 674 has a drain connected to the enable node NO2, a gate receiving the word-line enable signal NEWiB and a source connected to a negative voltage terminal VBN. The NMOS transistor 675 has a drain connected to the enable node NO2, a gate receiving the second word-line enable control signal PXiB and a source connected to the negative voltage terminal VBN. The boosted voltage VPP is applied to the boosted voltage terminal VPN and the negative voltage VBB2 is applied to the negative voltage terminal VBN.

The PMOS transistor 672 receives the boosted voltage VPP, and transfers the boosted voltage VPP to the boost node NO1 as a boosted node voltage PXiD in response to the first word-line enable control signal PXi. The PMOS transistor 673 receives the boosted node voltage PXiD from the PMOS transistor 672 through a source and enables a corresponding word-line WLi connected to the enable node NO2 with the boosted node voltage PXiD in response to the normal word-line enable signal NEWiB. The NMOS transistor 674 transfers the negative voltage VBB2 to the enable node NO2 in response to the normal word-line enable signal NEWiB and the NMOS transistor 675 disables the corresponding word-line WLi connected to the enable node NO2 with the negative voltage in response to the second word-line enable control signal PXiB.

Figure 29:
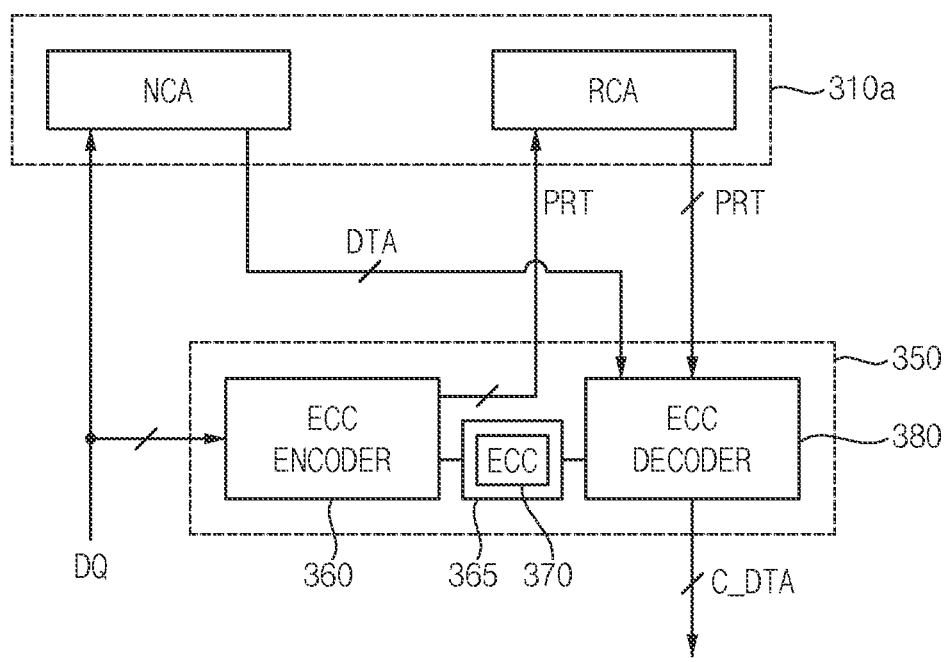
FIG. 29 is a block diagram illustrating an example of the ECC engine in the semiconductor memory device of FIG. 3 according to example embodiments.

FIG. 29 is a block diagram illustrating an example of the ECC engine in the semiconductor memory device of FIG. 3 according to example embodiments. Referring to FIG. 29, the ECC engine 350 may include an ECC encoder 360, an ECC decoder 380 and an (ECC) memory 365. The memory 365 may store an ECC 370. The ECC 370 may be a single error correction (SEC) code or a single error correction/double error detection (SECDED) code. The ECC encoder 360 may receive the data DTA from the data I/O buffer 320 and generate parity data PRT using the ECC 370, associated with the data DTA to be stored in the normal cell array NCA of the first bank array 310a. The parity data PRT may be stored in the redundancy cell region RCA of the first bank array 310a. The ECC decoder 380 may perform an ECC decoding operation on a read data DTA based on the parity data PRT read from the first bank array 310a using the ECC 370. When the read data DTA includes an error bit as a result of the ECC decoding, the ECC decoder 380 may correct the error bit in the read data DTA and may provide a corrected data C_DTA to the data I/O buffer 320.

Figure 30:
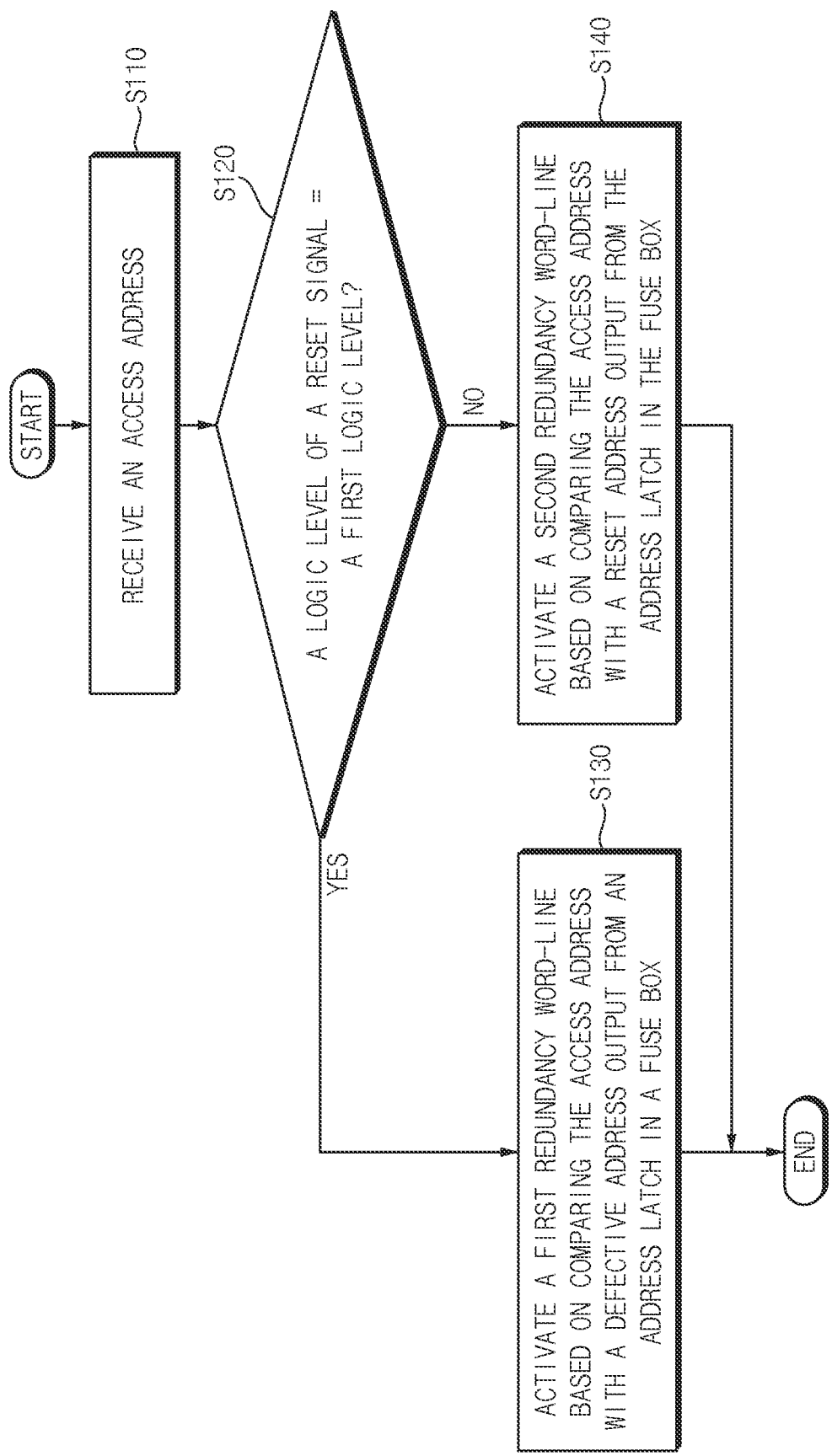
FIG. 30 is a flow chart illustrating a method of operating a semiconductor memory device according to example embodiments.

FIG. 30 is a flow chart illustrating a method of operating a semiconductor memory device according to example embodiments. Referring to FIGS. 3 through 30, there is provided a method of operating a semiconductor memory device 200 that includes a memory cell array 310 including a plurality of bank arrays, each of the plurality of bank arrays including a plurality of memory cells coupled to word-lines and bit-lines, wherein each of the plurality of bank arrays is divided into a plurality of row blocks by a row block identity bit corresponding to a portion of bits of a row address, each of the plurality of row blocks includes a plurality of sub-array blocks arranged in a first direction, and the plurality of row blocks are arranged in a second direction crossing the first direction. According to the method, an access address SRA is received from a memory controller 30 (operation S110). It is determined whether a logic level of a reset signal RST_Q output from a reset latch of a fuse box has a first logic level (operation S120).

When the reset signal RST_Q has a first logic level (YES in S120), a first redundancy word-line is activated, which is designated by a repair address replacing a defective address FL_ADDR based on comparing the access address SRA with the defective address FL_ADDR output from an address latch of the fuse box (operation S130). In contrast, when the reset signal RST_Q has a second logic level (NO in S120), a second redundancy word-line is activated, which replaces an edge word-line designated by the access address SRA based on comparing the access address SRA with a reset address RT_ADDR output from the reset latch of the fuse box (operation S140).

Figure 31:
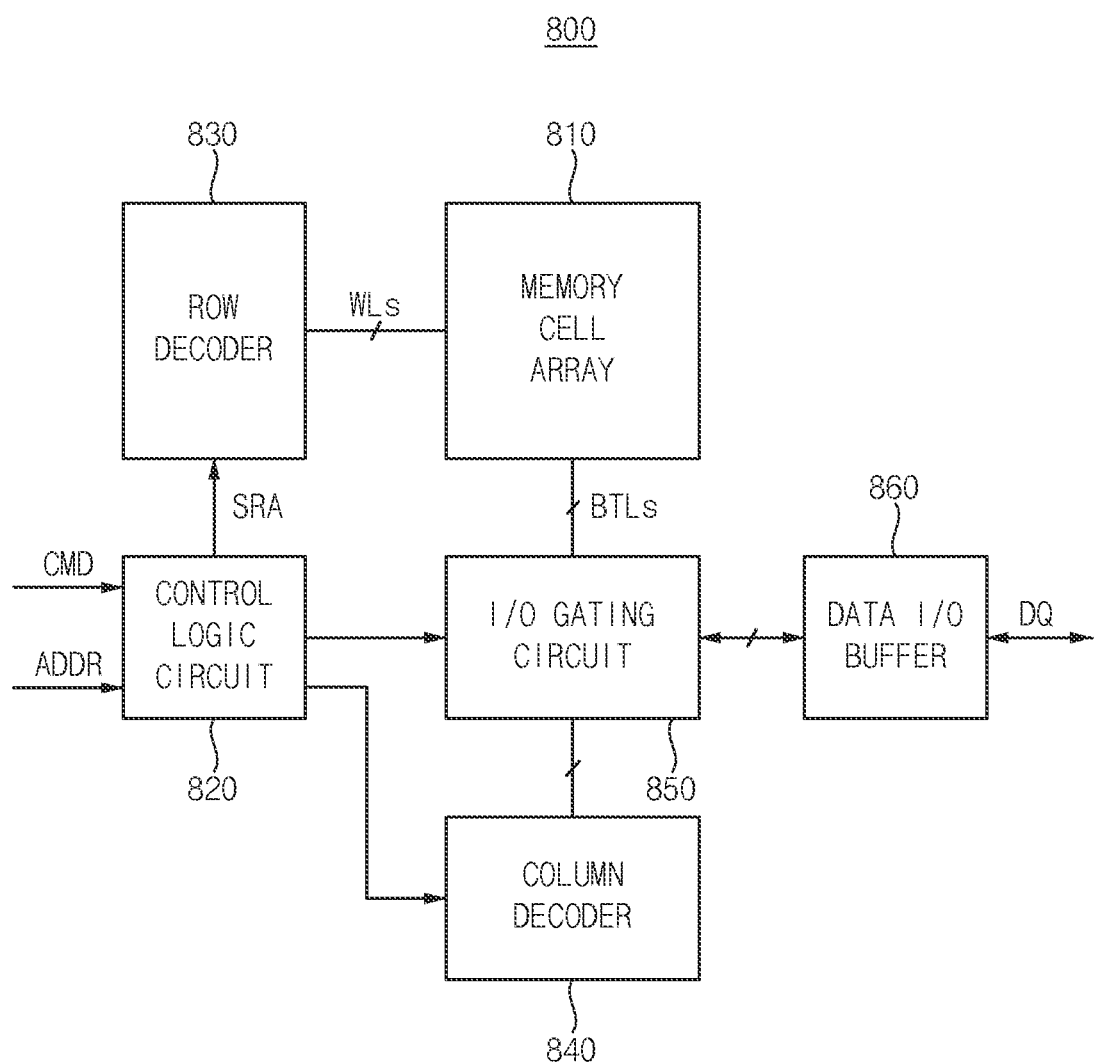
FIG. 31 is a block diagram illustrating an example of a semiconductor memory device according to example embodiments.

FIG. 31 is a block diagram illustrating an example of a semiconductor memory device according to example embodiments. Referring to FIG. 31, a semiconductor memory device 810 may include a memory cell array 810, a control logic circuit 820, a row decoder 830, a column decoder 840, an I/O gating circuit 850, and a data I/O buffer 860.

The memory cell array 810 may be connected to the row decoder 830 through word-lines WLs and connected to the I/O gating circuit 850 through bit-lines BTLs. The memory cell array 810 may correspond to the memory cell array 310 in FIG. 3. The control logic circuit 820 may control the row decoder 830, the column decoder 840 and the I/O gating circuit 850 based on a command CMD and an address ADDR received from an external memory controller. The control logic circuit 820 may provide a row address (an access address SRA) of the address ADDR to the row decoder 830.

The data I/O buffer 860 may receive/transmit a data signal DQ from/to the external memory controller.

The row decoder 830 may correspond to the first row decoder 260a in FIG. 14. Therefore, the row decoder 830 may include a repair controller. The may include a plurality of a plurality of fuse boxes corresponding to a plurality of row blocks in the memory cell array 810. A first fuse box from among the plurality of fuse boxes may store a first defective address. The repair controller may activate a first redundancy word-line replacing a first defective word-line designated by the first defective address based on comparing a first access address with the first defective address output from the first fuse box, in a first mode, and may activate a second redundancy word-line replacing a first edge word-line designated by the first access address based on comparing the first access address with a first reset address output from the first fuse box, in a second mode. The repair controller 500 may forcibly repair an edge word-line with the second redundancy word-line.

Therefore, in the semiconductor memory device and the method of operating a semiconductor memory device, a portion of fuse boxes storing defective addresses in the repair controller, in a second mode (when, the portion of fuse boxes are reset), may output a reset address designating an edge word-line disposed at an edge portion of a sub array block instead of outputting a defective address stored therein and the repair controller may bypass an access to the edge word-line by activating a redundancy word-line replacing the edge word-line. Accordingly, the same fuse box may be used to repair the edge word-line that is frequently defective in an early stages of development of the semiconductor memory device, and after the initial stage, the defect address stored in the fuse box may be repaired. Therefore, a performance of the semiconductor memory device may be enhanced without increasing an occupied area of the fuse boxes.

Figure 32:
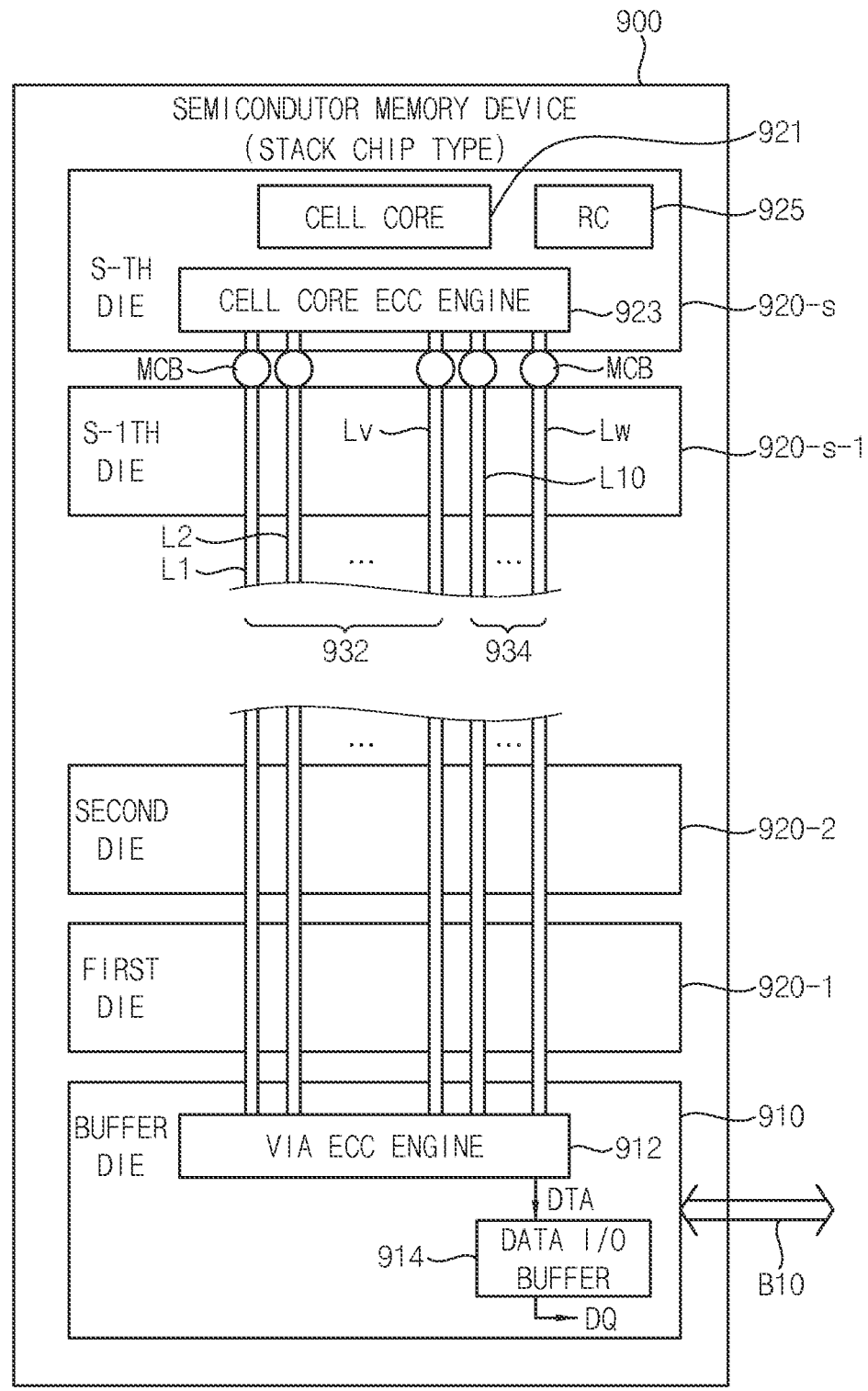
FIG. 32 is a block diagram illustrating a semiconductor memory device according to example embodiments.

FIG. 32 is a block diagram illustrating a semiconductor memory device according to example embodiments. Referring to FIG. 32, a semiconductor memory device 900 may include at least one buffer die 910 and a plurality of memory dies 920-1 to 920-s (s is a natural number equal to or greater than three) providing a soft error analyzing and correcting function in a stacked chip structure. The plurality of memory dies 920-1 to 920-s are stacked on the buffer die 910 and conveys data through a plurality of through silicon via (TSV) lines.

At least one of the memory dies 920-1 to 920-p may include a cell core 921 to store data, a cell core ECC engine 923 which generates transmission parity bits (i.e., transmission parity data) based on transmission data to be sent to the at least one buffer die 910 and a repair controller RC 925. The cell core 921 may include a plurality of memory cells having DRAM cell structure. The cell core 921 may be divided into a plurality of row blocks by a row block identity bit corresponding to a portion of bits of a row address, and each of the of row blocks includes a plurality of sub-array blocks arranged in a first direction.

The repair controller 925 may employ the repair controller 500 in FIG. 15. In the repair controller 925, a portion of fuse boxes storing defective addresses in the repair controller 925, in a second mode (when, the portion of fuse boxes are reset), may output a reset address designating an edge word-line disposed at an edge portion of a sub array block instead of outputting a defective address stored therein and the repair controller 925 may bypass an access to the edge word-line by activating a redundancy word-line replacing the edge word-line.

The buffer die 910 may include a via ECC engine 912 which corrects a transmission error using the transmission parity bits when a transmission error is detected from the transmission data received through the TSV liens and generates error-corrected data. The buffer die 910 may further include a data I/O buffer 914. The data I/O buffer 914 may generate the data signal DQ by sampling the data DTA from the via ECC engine 912 and may output the data signal DQ to an outside.

The semiconductor memory device 900 may be a stack chip type memory device or a stacked memory device which conveys data and control signals through the TSV lines. The TSV lines may be also called 'through electrodes'. The cell core ECC engine 923 may perform error correction on data which is outputted from the memory die 920-s before the transmission data is sent.

A data TSV line group 932 which is formed at one memory die 920-p may include 129 TSV lines L1 and L2 to Lv, and a parity TSV line group 934 may include 9 TSV lines L10 to Lw. The TSV lines L1 and L2 to Lv of the data TSV line group 932 and the parity TSV lines L10 to Lw of the parity TSV line group 934 may be connected to micro bumps MCB which are correspondingly formed among the memory dies 920-1 to 920-s.

The semiconductor memory device 900 may have a three-dimensional (3D) chip structure or a 2.5D chip structure to communicate with the host through a data bus B10. The buffer die 910 may be connected with the memory controller through the data bus B10.

According to example embodiments, as illustrated in FIG. 32, the cell core ECC engine 923 may be included in the memory die, the via ECC engine 912 may be included in the buffer die. Accordingly, it may be possible to detect and correct soft data fail. The soft data fail may include a transmission error which is generated due to noise when data is transmitted through TSV lines.

Figure 33:
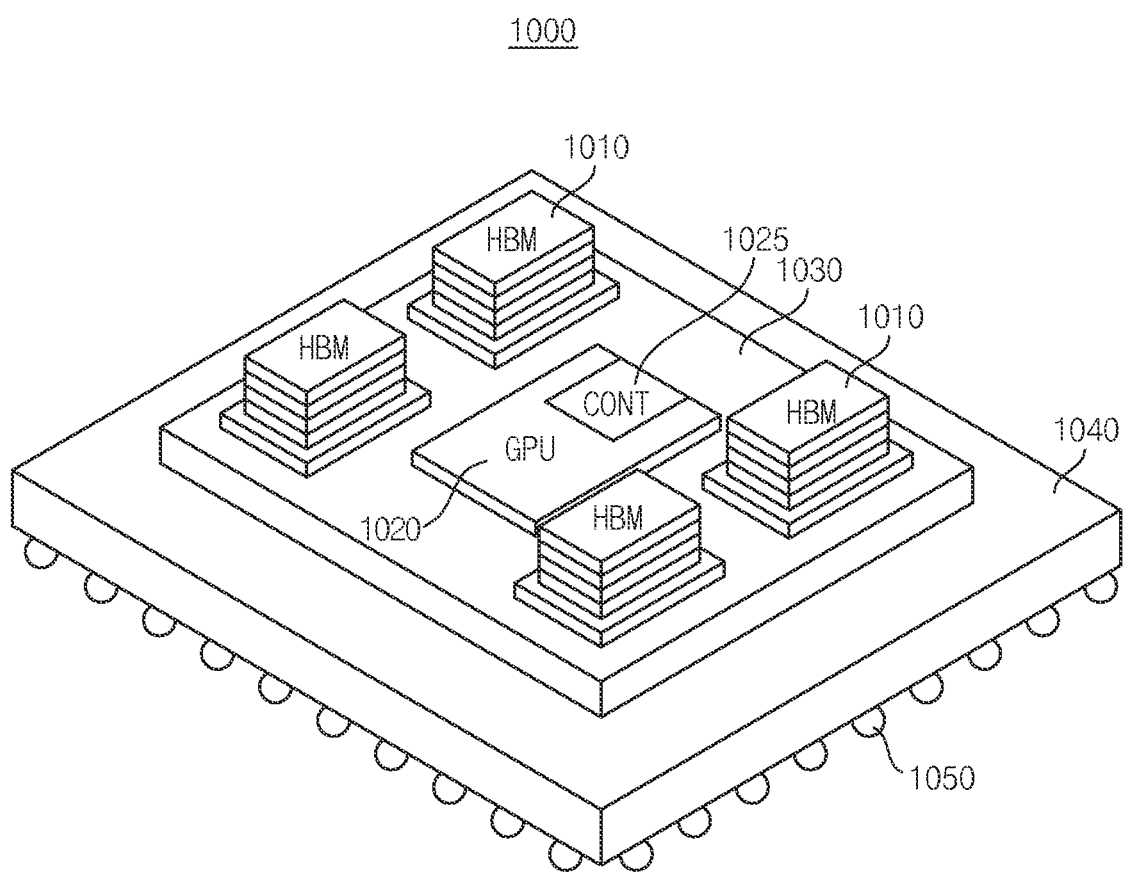
FIG. 33 is a diagram illustrating a semiconductor package including the stacked memory device, according to example embodiments.

FIG. 33 is a diagram illustrating a semiconductor package including the stacked memory device, according to example embodiments. Referring to FIG. 33, a semiconductor package 1000 may include one or more stacked memory devices 1010 and a graphic processing unit (GPU) 1020. The GPU 1020 may include a memory controller CONT 1025.

The stacked memory devices 1010 and the GPU 1020 may be mounted on an interposer 1030, and the interposer on which the stacked memory devices 1010 and the GPU 1020 are mounted may be mounted on a package substrate 1040. The package substrate 1040 may be mounted on solder balls 1050. The memory controller 1025 may employ the memory controller 100 in FIG. 1. Each of the stacked memory devices 1010 may be implemented in various forms, and may be a memory device in a high bandwidth memory (HBM) form in which a plurality of layers are stacked. Accordingly, each of the stacked memory devices 1010 may include a buffer die and a plurality of memory dies. Each of the memory dies may include a memory cell array and a repair controller as described previously.

The plurality of stacked memory devices 1010 may be mounted on the interposer 1030, and the GPU 1020 may communicate with the plurality of stacked memory devices 1010. For example, each of the stacked memory devices 1010 and the GPU 1020 may include a physical region, and communication may be performed between the stacked memory devices 1010 and the GPU 1020 through the physical regions.

Aspects of the present disclosure may be applied to systems using semiconductor memory devices that employ a plurality of volatile memory cells and an OTP memory device. For example, aspects of the present disclosure may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:
1. A semiconductor memory device, comprising:
a bank of memory cells electrically coupled to a plurality of word-lines and a plurality of bit-lines, wherein
the bank of memory cells are partitioned into a plurality of row blocks, each of the row blocks being divided into a plurality of sub array blocks, and the plurality of word-lines include at least one edge word line disposed at an edge of a sub array block of the plurality of sub array blocks; and
a row decoder electrically coupled by the plurality of word-lines to the bank of memory cells, the row decoder including a repair controller comprising a plurality of fuse boxes that correspond to respective ones of the plurality of row blocks of the bank of memory cells;
wherein a first fuse box from among the plurality of fuse boxes is configured to selectively output a first defective address and a first reset address, based on a reset signal received from a reset latch of the first fuse box; and
wherein the repair controller is configured to:
 activate a first redundancy word-line to replace a first defective word-line designated by the first defective address, when a first access address correlates with the first defective address output from the first fuse box, during a first mode; and
 activate a second redundancy word-line to replace the at least one edge word-line designated by the first access address, when the first access address correlates with the first reset address output from the first fuse box, during a second mode.

2. The semiconductor memory device of claim 1, wherein the first fuse box comprises:
a master latch configured to generate an enable signal that is activated in the first mode and the second mode;
a reset latch configured to generate a reset signal having a first logic level in the first mode and a second logic level different from the first logic level in the second mode;
an address latch configured to store the first defective address, output the first defective address in the first mode, and output the first reset address in the second mode, in response to the reset signal;
an address comparator configured to output a matching signal in response to comparing the first access address with an output of the address latch; and
a redundancy signal generator configured to generate a first redundancy enable signal that activates the first redundancy word-line in the first mode, and generate a second redundancy enable signal that activates the second redundancy word-line in the second mode, based on a combination of the enable signal, the reset signal and the matching signal.

3. The semiconductor memory device of claim 2, wherein the address latch includes:
a plurality of first bit cells configured to store first bits of a plurality of address bits of the first defective address, respectively; and
a second bit cell configured to store a second bit of the plurality of address bits of the first defective address.

4. The semiconductor memory device of claim 3, wherein, in the first mode, the first bit cells are set in response to the reset signal having the first logic level and the second bit cell is reset in response to the reset signal having the first logic level, such that the address latch outputs the first defective address.

5. The semiconductor memory device of claim 3, wherein, in the second mode, the first bit cells are reset in response to the reset signal having the second logic level and the second bit cell is set in response to the reset signal having the second logic level, such that the address latch outputs the first reset address.

6. The semiconductor memory device of claim 3, wherein each of the plurality of first bit cells comprises:
a first p-channel metal-oxide semiconductor (PMOS) transistor, which is electrically coupled between a power supply voltage and an output node, and has a gate electrically coupled to an inverted output node;
a first n-channel metal-oxide semiconductor (NMOS) transistor, which is electrically coupled between the output node and a ground voltage, and has a gate electrically coupled to the inverted output node;
a second PMOS transistor, which is electrically coupled between the power supply voltage and the inverted output node, and has a gate electrically coupled to the output node;
a second NMOS transistor, which is electrically coupled between the inverted output node and the ground voltage, and has a gate electrically coupled to the output node;
a first access transistor configured to transfer corresponding bit of the first bits to the output node based on a write control signal;
a second access transistor configured to transfer an inverted bit of the corresponding bit to the inverted output node based on the write control signal; and
a third NMOS transistor, which is electrically coupled between the output node and the ground voltage in parallel with the first NMOS transistor, and has a gate responsive to the reset signal.

7. The semiconductor memory device of claim 6, wherein the third NMOS transistor is configured to reset the output node in response to the reset signal having the second logic level in the second mode.

8. The semiconductor memory device of claim 3, wherein the second bit cell comprises:
a first p-channel metal-oxide semiconductor (PMOS) transistor, which is electrically coupled between a power supply voltage and an output node, and has a gate electrically coupled to an inverted output node;
a first n-channel metal-oxide semiconductor (NMOS) transistor, which is electrically coupled between the output node and a ground voltage, and has a gate electrically coupled to the inverted output node;
a second PMOS transistor, which is electrically coupled between the power supply voltage and the inverted output node, and has a gate electrically coupled to the output node;
a second NMOS transistor, which is electrically coupled between the inverted output node and the ground voltage, and has a gate electrically coupled to the output node;
a first access transistor configured to transfer the second bit to the output node based on a write control signal;
a second access transistor configured to transfer an inverted bit of the second bit to the inverted output node based on the write control signal; and
a third NMOS transistor, which is electrically coupled between the inverted output node and the ground voltage in parallel with the second NMOS transistor, and has a gate receiving the reset signal.

9. The semiconductor memory device of claim 8, wherein the third NMOS transistor is configured to reset the inverted output node in response to the reset signal having the second logic level in the second mode.

10. The semiconductor memory device of claim 1, wherein each of the plurality of row blocks includes normal memory cells coupled to normal word-lines and redundancy memory cells coupled to redundancy word-lines, which extend between the normal word-lines, and wherein the plurality of sub-array blocks include a first sub array block and a second sub array block extending in a second direction.

11. The semiconductor memory device of claim 10, wherein, in the second mode, the first access address designates the first edge word-line extending at a first edge of the first sub array block; and wherein the second redundancy word-line corresponds to one of the redundancy word-lines of the first sub array block.

12. The semiconductor memory device of claim 10, wherein, in the second mode, the first access address designates the first edge word-line disposed at a first edge of the first sub array block; and wherein the second redundancy word-line corresponds to one of the redundancy word-lines of the second sub array block.

13. The semiconductor memory device of claim 10,
wherein a second fuse box different from the first fuse box, from among the plurality of fuse boxes, is configured to store a second defective address different from the first defective address; and wherein the repair controller is further configured to:
activate a third redundancy word-line to replace a second defective word-line designated by the second defective address, in response to comparing a second access address with the second defective address output from the second fuse box, in the first mode; and activate a fourth redundancy word-line to replace a second edge word-line designated by the second access address, in response to comparing the second access address with a second reset address output from the second fuse box, in the second mode.

14. The semiconductor memory device of claim 13, wherein, in the second mode, the second access address designates the second edge word-line extending adjacent a second edge of the first sub array block; and wherein the fourth redundancy word-line corresponds to one of the redundancy word-lines of the first sub array block.

15. The semiconductor memory device of claim 13, wherein, in the second mode, the second access address designates the second edge word-line extending at a second edge of the first sub array block; and wherein the fourth redundancy word-line corresponds to one of the redundancy word-lines of the second sub array block.

16. The semiconductor memory device of claim 1, wherein the row decoder further comprises:
a pre-decoder configured to generate a decoded row address by decoding the access address;
a normal word-line driver configured to activate a row address corresponding to the decoded row address based on the decoded row address;
a blocking selection circuit configured to generate a normal word-line blocking signal based on a first redundancy enable signal and a second redundancy enable signal, and selectively provide the normal word-line blocking signal to the normal word-line driver; and
a redundancy word-line driver configured to activate the first redundancy word-line based on the first redundancy enable signal, in the first mode, and activate the second redundancy word-line based on the second redundancy enable signal, in the second mode.

17. The semiconductor memory device of claim 16, wherein the blocking selection circuit is configured to disable the normal word-line driver by activating the normal word-line blocking signal when the first redundancy enable signal is activated or the second redundancy enable signal is activated.

18. The semiconductor memory device of claim 1, further comprising an anti-fuse circuit configured to receive defective address information including the first defective address, and provide the defective address information to the repair controller during a power-up sequence of the semiconductor memory device.

19. A method of operating a semiconductor memory device, which includes: a memory cell array including a plurality of bank arrays, with each of the plurality of bank arrays including a plurality of memory cells coupled to a plurality of word-lines and a plurality of bit-lines, wherein
each of the plurality of bank arrays are divided into a plurality of row blocks, each of the row blocks being divided into a plurality of sub array blocks, and the plurality of word-lines include at least one edge word line disposed at an edge of a sub array block of the plurality of sub array blocks, the method comprising:
receiving an access address from an external memory controller;
determining whether a logic level of a reset signal output from a reset latch of a fuse box has a first logic level, wherein the fuse box is configured to selectively output a defective address and a reset address, based on the reset signal;
activating a first redundancy word-line designated by a repair address that replaces the defective address when the access address correlates with the defective address output from an address latch of the fuse box, in response to the reset signal having the first logic level; and
activating a second redundancy word-line to replace an edge word-line designated by the access address when the access address correlates with the reset address output from the address latch of the fuse box, in response to the reset signal having a second logic level.

20. A semiconductor memory device, comprising:
a memory cell array including a plurality of bank arrays, each of the plurality of bank arrays including a plurality of memory cells coupled to a plurality of word-lines and a plurality of bit-lines, wherein
each of the plurality of bank arrays is divided into a plurality of row blocks, each of the row blocks being divided into a plurality of sub array blocks, and the plurality of word-lines include at least one edge word line disposed at an edge of a sub array block of the plurality of sub array blocks; and
a row decoder electrically coupled to the memory cell array through one or more word-lines of the plurality of word-lines, the row decoder comprising a repair controller that includes a plurality of fuse boxes corresponding to the plurality of row blocks of the plurality of bank arrays;
wherein at least one fuse box from among the plurality of fuse boxes is configured to selectively output a defective address and a reset address, based on a reset signal received from a reset latch of the at least one fuse box; and
wherein the repair controller is configured to:
activate a redundancy word-line to replace a defective word-line designated by the defective address when the access address correlates with the defective address output from the at least one fuse box, in a first mode; and activate a second redundancy word-line to replace an edge word-line designated by the access address when the access address correlates with a reset address output from the at least one fuse box, in a second mode.

\* \* \* \* \*